(12) United States Patent
Arsenault et al.

(10) Patent No.: US 9,310,630 B2
(45) Date of Patent: Apr. 12, 2016

(54) TUNABLE BRAGG STACK

(71) Applicant: OPALUX INCORPORATED, Toronto (CA)

(72) Inventors: Andre Arsenault, Toronto (CA); Geoffrey Alan Ozin, Toronto (CA); Daniel Patrick Puzzo, Waterloo (CA)

(73) Assignee: Opalux Incorporation, Toronto (CA)

( * ) Notice: Subject to any disclaimer, the term of this patent is extended or adjusted under 35 U.S.C. 154(b) by 0 days.

(21) Appl. No.: 14/037,046

(22) Filed: Sep. 25, 2013

(65) Prior Publication Data

US 2014/0126037 A1 May 8, 2014

Related U.S. Application Data

(63) Continuation of application No. 12/995,338, filed as application No. PCT/CA2009/000745 on May 29, 2009, now Pat. No. 8,861,072.

(60) Provisional application No. 61/057,296, filed on May 30, 2008.

(51) Int. Cl.
*G02F 1/00* (2006.01)
*G02F 1/01* (2006.01)
(Continued)

(52) U.S. Cl.
CPC .............. *G02F 1/03* (2013.01); *G02F 1/0128* (2013.01); *G02F 1/0147* (2013.01); *G02F 1/15* (2013.01);
(Continued)

(58) Field of Classification Search
CPC .......... G02F 1/00; G02F 1/01; G02F 1/0147; G02F 1/0128; G02F 1/03; G02F 1/1334; G02F 1/193; G02F 1/15; G02F 1/21; G02F 2001/151; G02F 2001/1515; G02F 2201/305; G02F 2201/346; G02F 2202/022; B32Y 20/00; B32Y 30/00; H01L 33/46; H01L 33/50; H01L 33/501; H01L 33/502; H01L 33/504; H01L 33/505; H01L 2924/0002; H01L 2924/00

USPC ......... 359/268, 237, 238, 272, 288, 290, 291, 359/296, 318, 321–324, 359, 542, 578, 580, 359/584, 589; 385/12, 13, 27, 37, 39, 123, 385/125; 977/773

See application file for complete search history.

(56) References Cited

U.S. PATENT DOCUMENTS

| | | | |
|---|---|---|---|
| 4,373,782 A | 2/1983 | Thelen | 398/79 |
| 5,170,407 A | 12/1992 | Schubert et al. | 372/96 |

(Continued)

FOREIGN PATENT DOCUMENTS

| | | |
|---|---|---|
| CN | 1466700 | 1/2004 |
| JP | 2002-098916 | 4/2002 |

(Continued)

OTHER PUBLICATIONS

Almeida, et al., Curr Opin in Solid State Mat Sci. 7:151-7, 2003.

(Continued)

*Primary Examiner* — Loha Ben
(74) *Attorney, Agent, or Firm* — Norton Rose Fulbright US LLP

(57) ABSTRACT

A tunable photonic crystal device comprising: alternating layers of a first material and a second material, the alternating layers comprising a responsive material, the responsive material being responsive to an external stimulus, the alternating layers having a periodic difference in refractive indices giving rise to a first reflected wavelength; wherein, in response to the external stimulus, a change in the responsive material results in a reflected wavelength of the device shifting from the first reflected wavelength to a second reflected wavelength.

31 Claims, 18 Drawing Sheets

(51) Int. Cl.
*G02F 1/03* (2006.01)
*G02F 1/15* (2006.01)
*G02F 1/21* (2006.01)
*H01L 33/46* (2010.01)
*H01S 3/08* (2006.01)
*B82Y 20/00* (2011.01)

(52) U.S. Cl.
CPC . *G02F 1/21* (2013.01); *B82Y 20/00* (2013.01); *G02F 1/009* (2013.01); *G02F 2001/151* (2013.01); *G02F 2001/1515* (2013.01); *G02F 2201/346* (2013.01); *G02F 2202/32* (2013.01); *H01L 33/46* (2013.01); *H01L 2924/0002* (2013.01); *H01L 2933/0083* (2013.01); *H01S 3/08059* (2013.01); *Y10S 977/773* (2013.01)

(56) References Cited

U.S. PATENT DOCUMENTS

| | | | | |
|---|---|---|---|---|
| 5,337,328 | A | 8/1994 | Lang et al. | 372/45.01 |
| 5,799,231 | A | 8/1998 | Gates et al. | 399/115 |
| 5,808,798 | A | 9/1998 | Weber et al. | 359/583 |
| 5,872,609 | A | 2/1999 | Hiji et al. | 349/123 |
| 5,929,953 | A | 7/1999 | Hiji et al. | 349/86 |
| 6,002,700 | A | 12/1999 | Sato | 372/45.01 |
| 6,262,830 | B1 | 7/2001 | Scalora | 359/248 |
| 6,300,650 | B1 | 10/2001 | Sato | 257/184 |
| 6,582,807 | B2 | 6/2003 | Baer et al. | 428/212 |
| 6,597,017 | B1 | 7/2003 | Seko et al. | 257/79 |
| 6,696,142 | B2 | 2/2004 | Baer et al. | 428/212 |
| 6,825,982 | B1 | 11/2004 | Ting | 359/580 |
| 6,867,902 | B2 | 3/2005 | Romagnoli et al. | 359/326 |
| 6,956,689 | B2* | 10/2005 | Takiguchi et al. | 359/290 |
| 7,002,646 | B2* | 2/2006 | Misewich et al. | 349/74 |
| 7,129,469 | B2 | 10/2006 | Mochizuki et al. | 250/226 |
| 7,230,768 | B2 | 6/2007 | Pinho | 359/634 |
| 7,319,560 | B2* | 1/2008 | Gunning et al. | 359/578 |
| 7,355,792 | B2 | 4/2008 | Shang | 359/587 |
| 7,364,673 | B2* | 4/2008 | Arsenault et al. | 252/586 |
| 7,409,133 | B2* | 8/2008 | Dimmick et al. | 385/123 |
| 7,457,495 | B2* | 11/2008 | Dimmick et al. | 385/37 |
| 7,539,361 | B2* | 5/2009 | Dimmick et al. | 385/12 |
| 7,566,942 | B2 | 7/2009 | Viens et al. | 257/440 |
| 7,826,131 | B2* | 11/2010 | Arsenault et al. | 359/318 |
| 7,901,870 | B1 | 3/2011 | Wach | 430/321 |
| 7,903,339 | B2 | 3/2011 | Banerjee et al. | 359/588 |
| 8,268,637 | B2 | 9/2012 | Cunningham et al. | 436/524 |
| 8,324,652 | B1* | 12/2012 | Lester et al. | 257/99 |
| 8,339,543 | B2* | 12/2012 | Tang et al. | 349/88 |
| 8,368,998 | B2* | 2/2013 | Tang et al. | 359/296 |
| 8,422,114 | B2* | 4/2013 | Hashimura et al. | 359/290 |
| 2007/0063208 | A1 | 3/2007 | Klimov et al. | 428/701 |

FOREIGN PATENT DOCUMENTS

| | | |
|---|---|---|
| JP | 2002-318373 | 10/2002 |
| JP | 2005-031172 | 2/2005 |
| JP | 2006-171533 | 6/2006 |
| JP | 2008-026346 | 2/2008 |
| WO | WO 2005/101103 | 10/2005 |
| WO | WO 2008/017864 | 2/2008 |
| WO | WO 2008/034932 | 3/2008 |

OTHER PUBLICATIONS

Arsenault, et al., Advanced Materials. 15(6):503-7, 2003.
Arsenault, et al., Nature Photonics. 1:468-472, 2007.
Chen, et al., Applied Physical Letters. 75(24):3805-3807, 1999.
Choi, et al., Nano Letters. 6(11):2456-61, 2006.
Colodrero et al., "Nanoparticle-Based One-Dimensional Photonic Crystals", *Langmuir*, 24(9):4430-4434, 2008.
Extended European Search Report issued in European Patent Application No. 09753385.3, dated Apr. 3, 2013.
Foucher, et al., J Am Chem Soc. 114:6246-48, 1992.
Ge et al., "Highly Tunable Superparamagnetic Colloidal Photonic Crystals", *Angewandte Chemie*, 46(39):7428-7431, 2007.
International Search Report and Written Opinion for International Application No. PCT/CA2009/000745 nailed Aug. 24, 2009.
Jethmalani, et al., Am Chem Soci, Langmuir. 13:2633-9, 1997.
Lu, et al., Nano Letters. 2(70:785-88, 2002.
Monch, et al., Applied Physics Letters. 89(16):165104, 2006.
Office Communication in Chinese Patent Application No. 200980130168.1 mailed Aug. 22, 2012.
Office Communication in Japanese Patent Application No. 2011-510793 mailed Dec. 4, 2012.
Schwarzl, et al., IEEE J Quantum Electronics. 35(12):1753-8, 1999.
Wu, et al., Small. 3(8):1445-51, 2007.
Zhai, et al., Am Chem Soc Macromolecules. 37:6113-23, 2004.

* cited by examiner

| Material | Concentration (wt. %) | Additive (wt.%) | $n_{eff}$ | Porosity (%) | Thickness (nm) |
|---|---|---|---|---|---|
| $SiO_2$ | 5.8 | - | 1.21 | 38 | 287 |
| $TiO_2$ | 5.0 | 1.25-2.5 PEG* | 1.80 | 34 | 80 |
| $SnO_2$ | 13.9 | - | 1.55 | 28 | 105 |
| $Sb:SnO_2$ | 10.1 | 0.5-1.0 PEG | 1.24 | 51 | 62 |

*PEG: poly(ethylene glycol), 125 kDa (Aldrich)

A

B

TUNABLE BRAGG STACK

CROSS-REFERENCE TO RELATED APPLICATIONS

This application is a continuation of U.S. patent application Ser. No. 12/995,338 filed Mar. 25, 2011, now U.S. Pat. No. 8,861,072, which is a national phase application under 35 U.S.C. §371 of International Application No. PCT/CA2009/000745 filed 29 May 2009, which claims priority to U.S. Provisional Application No. 61/057,296 filed 30 May 2008. The contents of the referenced applications are specifically incorporated herein by reference.

TECHNICAL FIELD

The present disclosure relates to tunable photonic crystals. In particular, the present disclosure relates to tunable one-dimensional photonic crystals.

BACKGROUND

The field of photonic crystals (PCs) has for some years received considerable attention from researchers in both academia as well as industry. Such materials are of interest because they interact with visible light through a periodic spatial modulation in their refractive index. In particular, the periodic modulation of refractive indices found in PCs result in the selective reflection of light having wavelengths that correspond to the periodicity of this modulation. An interaction of interest occurs when this periodicity of the refractive index of a PC is comparable to the wavelength of visible light (Arsenault et al., *Adv. Mater.* 2003, vol. 6 p. 503). This results in an interaction with light that is detectable by the naked eye.

Photonic crystals can be prepared in a one-, two-, or three-dimensional form, with the three-dimensional form to this point in literature representing the more common PC obtainable from bottom-up methodologies. A one-dimensional PC typically comprises periodically alternating layers having different refractive indices. One form of one-dimensional PCs is the distributed Bragg reflector (DBR), also referred to as a Bragg Stack.

DBRs are thin film nanostructures consisting of alternating layers of materials with varying dielectric constants. An example of a DBR is illustrated in FIG. 1. As shown in FIG. 1, each layer boundary causes a partial reflection of an optical wave with many boundaries giving rise to multiple reflections. Provided that the variation in refractive index is periodic, which may be achieved when each layer of equal refractive index is deposited with the same thickness, the many reflected waves can constructively interfere effectively creating a high-quality reflector. The range of wavelengths that are reflected by the DBR is called the photonic stopband. Within this range of wavelengths, light is "forbidden" to propagate in the structure and is instead reflected. Such structures are commonly employed in all branches of optics as frequency selective filters or as antireflective coatings.

In an attempt to impart added functionality to DBRs, variations to the conventional DBR structure have been investigated. Rubner et al. reported the assembly of stacked polyelectrolyte multilayer heterostructures with alternating fully dense and porous regions (Zhai et al., *Macromolecules* 2004, vol., 37 p. 6113). The pH-gated porosity of the regions that comprised poly(allylamine hydrochloride) (PAH) and poly(acrylic acid) (PAA) provided a mechanism for achieving reversible refractive-index contrast against fully dense, pH-insensitive regions constructed from PAH and poly(sodium 4-styrenesulfonate) (SPS). The group demonstrated control over the thicknesses of the high and low index regions enabling them to position the reflection band of these one-dimensional photonic crystals (i.e., Bragg Stacks) across the visible spectrum. In addition to the simple demonstration of this "structural color", they also showed that the reflection-peak wavelength (and therefore the observed color) was sensitive to the condensation of various species in the porous regions. Applications as sensors for trace amounts of solvent vapour and as monitorable drug-delivery systems were discussed. However, these one-dimensional photonic crystals can only reflect a fixed wavelength, as controlled during manufacture of the material. Changes in the reflected wavelength depend on adsorption of various species in the porous regions and cannot be controlled otherwise.

The same group of Rubner et al. reported the observance of structural color from $TiO_2/SiO_2$ Bragg reflectors (Wu et al., *Small* 2007, vol. 3 p. 1445). The nanoparticle DBRs were assembled by polyelectrolyte-assisted layer-by-layer deposition with subsequent thermal treatment of the films to remove the polymer components. The resulting conformal, nanoporous thin-film coatings show the expected narrow-wavelength reflection bands that lead to analyte-sensitive structural color. In addition, the films show favourable superhydrophilicity (antifogging) and self-cleaning properties. Again, changes in the reflected wavelength are dependent on adsorption of analytes within the pores of the material.

Choi et al. reported the preparation of Bragg reflectors consisting of alternating layers of $TiO_2$ and $SiO_2$ mesoporous materials (Choi et al., *Nano Lett.* 2006, vol. 6 p. 2456). Each layer was prepared by spin coating from the appropriate sol solution followed by a thermal treatment step. The authors demonstrated reversible sensitivity of the structural color of such mesoporous DBRs to the infiltration and removal of analytes in their porous structures. Changes in the reflected wavelength are dependent on adsorption of analytes within the pores of the material.

Currently, tuning of the structural color in such one-dimensional photonic crystal structures has only come from the adsorption of analytes which causes a refractive index change in the pores and a subsequent shift in the Bragg reflection maximum. It would be desirable to expand the functionality of DBRs, for use in other applications.

SUMMARY

In some aspects, there is provided a tunable photonic crystal device comprising: alternating layers of a first material and a second material, the alternating layers comprising a responsive material, the responsive material being responsive to an external stimulus, the alternating layers having a periodic difference in refractive indices giving rise to a first reflected wavelength; wherein, in response to the external stimulus, a change in the responsive material results in a reflected wavelength of the device shifting from the first reflected wavelength to a second reflected wavelength.

In some aspects, there is provided a tunable photonic crystal electrochemical cell comprising: an electrically conductive working electrode and an electrically conductive counter electrode, the working and counter electrodes being spaced apart; the device described above between the working and counter electrodes, in contact with at least one of the first and second electrically conductive electrodes; a conductive solution provided between the working and counter electrodes, the solution being in electrical communication with both the working and counter electrodes and the device; the cell being adapted to be connected to an electrical source for applying an electrical potential between the working electrode and the counter electrode to provide an electrical stimulus to the device.

In some aspects, there is provided a method of manufacturing a tunable photonic crystal device comprising the steps of: providing a substrate; fabricating alternating layers of a first material and a second material on the substrate, the alternating layers having a periodic difference in refractive indices giving rise to a first reflected wavelength; and embedding the alternating layers with a responsive material, the responsive material having a change in response to an external stimulus, resulting in a reflected wavelength of the device shifting from the first reflected wavelength to a second reflected wavelength.

In some aspects, there is provided a method of manufacturing a tunable photonic crystal electrochemical cell, the method comprising: providing an electrically conductive working electrode; providing the device described above in electrical communication with the working electrode; providing an electrically conductive counter electrode spaced apart from the working electrode; providing an ionically conductive electrolyte between the working and counter electrodes, the electrolyte being in electrical communication with the working and counter electrodes and the photonic crystal material; sealing the electrolyte between the working and counter electrodes; and providing electrical connections for connecting the cell to an electrical source, in order to apply an electrical stimulus to the device.

In some aspects, there is provided a display device, an indicator, a laser component, and an optical transmission component comprising the device or cell as described above.

DETAILED DESCRIPTION

Figure 1:
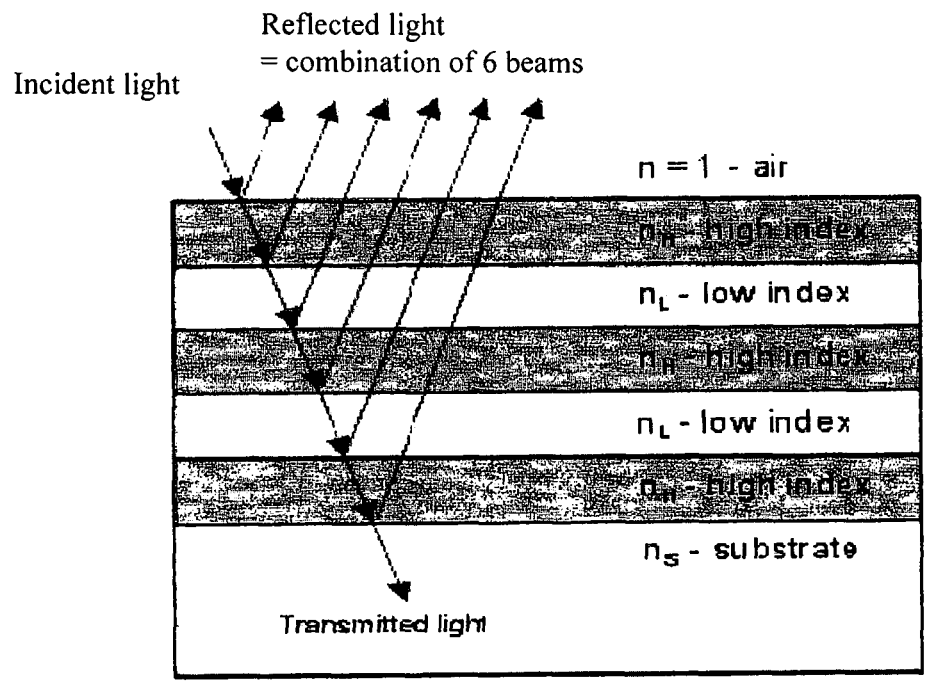
FIG. 1 illustrates a distributed Bragg reflector (DBR)

This disclosure describes a tunable photonic crystal device, referred to here as a distributed Bragg reflector (DBR), a method of manufacturing the DBR, an electrochemical cell using the DBR, and a method of manufacturing the cell. In particular, this disclosure describes a bottom-up approach to manufacturing a DBR, including the manufacture of a DBR having alternating layers of two or more different compositions of nanoparticles.

It would be desirable to impart a specific functionality to DBRs (also referred to as one-dimensional photonic crystals) by developing an intelligent photonic crystal (PC) system in which the reflected wavelength changes in response to an external stimulus, such as an electrical stimulus. This change in reflected wavelength may be due to a change in the lattice spacing of the DBR. By "intelligent" is meant that the change in reflected wavelength is due to changes in the DBR itself, not merely due to the infiltration or adsorption of analytes. Thus a tunable DBR as described in this disclosure would provide further functionality. From a theoretical standpoint, the Bragg equation governing the reflectance of DBRs may be completely scalable. This indicates that the lattice spacing of a DBR can be varied continuously and so, a DBR that is capable of reflecting any wavelength of light, including any color in the visible spectrum is proposed.

Some DBR theory may aid in understanding the present disclosure. A DBR typically comprises periodically alternating layers of a high refractive index material and a low refractive index material. As polychromic white light, which consists of all colors in equal proportions, falls on a photonic crystal, a series of scattering events ensue whereby only a narrow band of wavelengths typically centered about one single wavelength, $\lambda$, are reflected coherently with resulting interference. The first-order central wavelength, $\lambda$, may be predicted by the Bragg equation (Wu et al., Small 2007, vol. 3 p. 1445):

$$\lambda = 2(n_1 d_1 + n_2 d_2) \qquad \text{eqn.1}$$

where $\lambda$ is the normal incidence first-order reflected wavelength and $n_1$ and $d_1$ are the refractive index and thickness, respectively, of the low-index material and $n_2$ and $d_2$ the refractive index and thickness of the high-index material in the film. Note that it is this reflected wavelength predicted by the Bragg equation that corresponds to the color of the respective photonic crystal at the given angle of incidence.

The Bragg equation indicates that the band of wavelengths reflected by a DBR is dependent on the optical thicknesses, $n_1 d_1$ and $n_2 d_2$ (i.e., refractive index multiplied by physical thickness of each layer). Thus, by simply manipulating the optical thicknesses of each layer, the color of a thin-film heterostructure can be varied across a range of wavelengths in the electromagnetic spectrum. Such an approach however may not yield a dynamically tunable reflector capable of reflections of multiple colors from a single film. With this approach, one film reflects solely one color. However, if one is capable of dynamically tuning the lattice spacing of a PC, one may subsequently be capable of dynamically tuning its corresponding color, $\lambda$. With this particular approach, multiple colors may be obtainable from a single film, the color change stemming from a response to an external stimulus. This color change may also be reversible, which may be desirable for certain applications.

The intensity of the reflectance band centered at λ in air is given by the following expression:

$$R=[(1-Y)/(1+Y)]^2 \times 100 (\%)$$

$$Y=(n_2/n_1)^{N-1}(n_2^2/n_s) \qquad \text{eqn. 2}$$

where $n_2$, $n_1$, and $n_s$ are the refractive indices of the high-index material, the low-index material, and the substrate, respectively, and N is the number of stacks (i.e., layers in the DBR). Equation 2 effectively illustrates that the reflectance, R, increases with increasing values of the refractive-index contrast ratio, $n_2/n_1$, as well as with the number of layers, N.

The fabrication of DBRs having dense and continuous (i.e. not porous) alternating layers of high- and low-index materials is known. DBRs fabricated in this manner exhibit a very intense broadband reflectance rendering such suitable for a variety of applications. However, it may be desirable to provide greater functionality than that afforded by such structures.

The present disclosure describes a method of fabricating distributed Bragg reflectors (DBRs, also referred to as Bragg Stacks). Also described is a tunable DBR structure. In particular, the tunable DBR may be tuned in response to external stimuli, for example an electrical stimulus, a magnetic stimulus, or a mechanical stimulus.

The tunable DBR comprises periodically alternating layers of a first and a second material, each having different refractive indices. Although this description refers to a first and a second material for each respective layer, in some embodiments, there may be more than one type of material in each layer (i.e., a layer may be a mixed layer, comprising two or more different materials), which may provide added functionality. These layers may include flat sheets of material. These layers may also be made of microparticles or nanoparticles. In some embodiments, the layers may be made only of nanoparticles. The use of only nanoparticles may allow the layers to have a thickness of no more than a few hundred nanometers, which may result in a reflectance spectrum within the visible wavelengths. The use of microparticles may result in thicker layers, which may result in a reflectance spectrum outside of the visible wavelengths, for example in far infrared or microwaves. While not visually detectable, changes in such non-visible wavelengths may be detectable by other means, such as infrared detectors.

In the case of microparticles or nanoparticles, the particles may form organized layers or films through self-assembly processes. The micro- or nanoparticles may have cross-sectional dimensions ranging in size from about 60 nanometers to about 100 micrometers, or may be smaller, ranging in size from about 1 nanometer to about 150 nanometers. The DBR may have alternating layers of different materials in flat sheets, alternating layers of micro- or nanoparticle materials, or alternating layers of materials in flat sheets and micro- or nanoparticle materials. In any of these layers, micro- or nanoparticle materials may be a constituent of the flat sheets in combination with one or more other types of materials. Other common structures for DBRs would also be suitable for the tunable DBR.

For example, the first or second material may include nanoparticles or microparticles selected from: metal nanoparticles, polymer nanoparticles, inorganic nanoparticles, and semiconductor nanoparticles. Examples of such nanoparticles include: silica, titanium oxide, carbon materials (such as graphite, diamond, amorphous forms of carbon, $C_{60}$, fullerenes, graphenes, and carbon nanotubes), polymers (such as polystyrene and polymethylacrylate), silicon, silicon carbide, germanium, simple and complex binary and ternary metal oxides, metal chalcogenides, metal borides, metal phosphides, metal silicides, metal carbides, metal nitrides, iron oxide, tin oxide, antimony doped tin oxide, zinc oxide, and combinations thereof.

The nano- or microparticles may be substantially in the form of spheres, ellipsoids, rods, wires, tubes, sphere containing polyhedra, cubes, sheets, polyhedra, or an aggregate shape. There may also be no regular shape to the particles. The particles may also be modified in order to increase adhesion between the particles and a responsive material (discussed below) and/or between the particles and a substrate for the tunable DBR. The particles may also be core-shell heterogeneous particles, in which the particle has a core of one material with a concentric shell of a different material. A variety of such core-shell particles may be possible, and specific examples may include gold-silica, silver-silica, gold-titania, silver-titania, and may also include core-shell quantum dots (e.g., semiconductor nanoparticles) such as cadmium selenide-cadmium sulphide, and cadmium selenide-zinc selenide. One example of silica-coated silver nanoparticles that may be suitable is described in Lu Y, et al. Nano Lett. 2002, Vol. 2, page 785. Other materials suitable for manufacturing photonic crystals may be used.

The nano- or microparticles may have a functional coating on the surface of the particle. An example of a functional coating may be a ligand coated on the surface of the particle. Such coatings may affect and/or aid in: forming of the particle layers, coating of the particles on a substrate, solubility of the particles in solvents, adhesion of the particles, and refractive index of the particle, among others.

The tunable DBR may have an even number of layers (i.e., same number of layers of the first material as the second material) or an odd number of layers. While any number of layers may be suitable, typically a tunable DBR has at least 2 bilayers, where one bilayer is defined as one layer of the first material and one layer of the second material. The greater the number of alternating layers in the DBR, the greater the reflectivity of the resultant DBR, provided that the periodicity in the alternating layers is maintained.

The wavelength reflected from the DBR is dependent on the refractive index contrast (RIC) of the two alternating materials, as well as the periodicity of the bilayers (i.e., the distance and/or thickness between the alternating layers). Hence, the DBR may be tuned by varying the refractive index of one or both of the materials, or by varying the thickness and/or distance of the layers, or both. A particular reflected wavelength and a particular wavelength tuning response may be achieved by designing the DBR with layers having certain refractive indices and physical thicknesses. The tunable DBR may reflect any wavelength in the spectrum, including visible wavelengths, ultraviolet wavelengths, infrared wavelengths, or combinations thereof, and may shift between these ranges of wavelengths.

The tunable DBR has the additional ability to be dynamically tuned. That is, its reflected wavelength is not fixed, but may be tuned in response to an external stimulus. This external stimulus may be a mechanical, chemical, electrical, magnetic, or radiation stimulus. The external stimulus may cause a change in the refractive index of one or both materials, and/or a change in the periodicity of the layers.

Tunable change in the periodicity of the layers may be achieved by integrating into one or both layer materials a responsive material that undergoes a change in dimension in response to an external stimulus. For example, the responsive material may swell, shrink, compress, expand, or otherwise distort, in response to the external stimulus. In the case where the layers of the DBR are formed by microparticles or nanoparticles, infiltrating the layers with an expanding/contracting responsive material may result in the lattice spacing between the microparticles or nanoparticles also expanding or shrinking as the responsive material changes dimension. This change in lattice spacing results in a change in the overall thickness of the layer and thus a change in the reflected wavelength.

Tunable change may also be achieved by embedding one or both layer materials with a responsive material that undergoes a change in refractive index in response to an external stimulus. Where the layers are infiltrated with a responsive material that changes refractive index, the spacing between the layers may be unchanged, and change in the reflected wavelength may be due to the changes in the refractive index.

Alternatively, tunability may be achieved by a combination of refractive index change and periodicity change, for example by embedding one or more responsive materials having different responses to an external stimulus.

The responsive material may contain voids in addition to or in place of the micro- or nanoparticles. This may be the case, for example, where the micro- or nanoparticles are etched out of the layer after incorporation of the responsive material. The presence of voids may alter the refractive index of the material, may allow for adsorption of analytes, may improve transport of electrolytes into the DBR, may make the material more compressible by mechanical forces, and/or may improve the response time of the DBR to an external stimulus.

The responsive material may be a polymer material, such as an electroactive polymer that is responsive to electrical stimulation. The electrical response of the polymer may be due to the presence of atoms or chemical groups on the polymer—either on the polymer backbone itself, as a functional group or chain hanging off the backbone, or mixed with but not bound to the polymer—which respond to an electrical field or current. These may be atoms or groups that can be oxidized or reduced, such as iron atoms or thiophene groups as found in common commercial conducting polymers, so that the polymer can maintain an electrical charge even after the electric current is removed. In other embodiments, the polymer includes groups which respond to the electric field, but do not oxidize or reduce. Such groups include ionic groups which would move within the electric field, but tend to drift back to their original positions once the field is removed. In other embodiments, the polymer may have piezoelectric properties (e.g., the polymer may be polyvinylidene difluoride), such that the polymer structure itself may exhibit a change in dimensions under the influence of an electrical stimulus such as an electric field. The responsive material may be chosen or designed to have components (e.g., linking units or atoms in the polymer) that gives rise to the desired chemical, physical, electrochemical, optical, magnetic, and/or electronic properties for responding to the external stimulus.

Possible metal atoms that may be used in an electroactive polymer include: titanium, vanadium, chromium, manganese, iron, cobalt, nickel, copper, niobium, molybdenum, ruthenium, rhenium, platinum, palladium, rhodium, zinc, and combinations thereof. These metal atoms may be chemically integrated into the polymer, and they may be connected together directly and/or through linking units. The direct connections or linking units themselves may provide certain chemical, physical, electrochemical, optical and/or electronic properties to the polymer. Possible linking units include: substituted or unsubstituted carbanions, conjugated carbanions, linear olefins, cyclic olefins, acetylenes, phosphines, amines, carbonyls, carbenes, alkoxides, and combinations thereof. The metal atom may also have side-chain ligands including: substituted or unsubstituted carbanions, conjugated carbanions, linear olefins, cyclic olefins, acetylenes, phosphines, amines, carbonyls, carbenes, alkoxides, fullerenes and combinations thereof.

Figure 2:
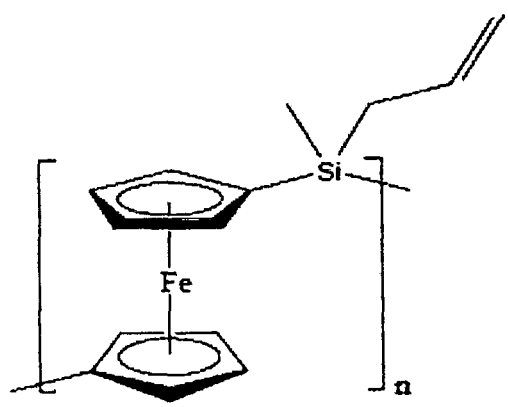
FIG. 2 shows the molecular structure of polyferrocenylsilane.

The responsive material may be a metallopolymer. One example of a metallopolymer is polyferrocenylsilane (PFS) gel, shown in FIG. 2. PFS is a polymer whose main chain is composed of alternating substituted silicon atoms and ferrocene groups connected by the 1- and 1'-positions of the ferrocenyl cyclopentadienyl rings. It may be obtained in high molecular weight via a number of methods, including transition metal catalyzed ring-opening-polymerization (ROP) or anionic ROP (Foucher et al., *J. Am. Chem. Soc.* 1992, vol. 114 p. 6246). Each of these described methods could be scalable and reproducible to larger quantities.

The polymer may be formed from a metal-containing monomer, oligomer or pre-polymer, for example bridged metallocenophanes. Possible bridged metallocenophanes include: substituted sila-1-ferrocenophanes, such as dialkylsila-1-ferrocenophanes, alkylalkoxysila-1-ferrocenophanes, dialkoxysila-1-ferrocenophanes, cycloalkylsila-1-ferrocenophanes, diarylsila-1-ferrocenophanes, alkylarylsila-1-ferrocenophanes, alkylalkenylsila-1-ferrocenophanes, alkylalkynylsila-1-ferrocenophanes, and combinations thereof. A metal-containing crosslinker may be used, for example: cyclobutylsila-1-ferrocenophane, sila-1,1'-diferrocenophane, 1,2-bis(methylsila-[1]-ferrocenophane)acetylene, 1,4-bis(methylsila-[1]-ferrocenophane)benzene, bis(methylsila-[1]-ferrocenophane)-1,4-diethynylbenzene, 1,2-bis(methylsila-[1]-ferrocenophane)ethane, and combinations thereof.

Other suitable polymers may include: polyferrocenylsilanes, polythiophenes (e.g., polyethylenedioxythiophene complex with polystyrenesulfonate), polypyrroles, polyanilines, polyphenylene vinylenes, polyacetylenes, polyfluorenes, polyphenylenevinyidenes, polyacetylenes, conducting polymers, conjugated polymers, metallopolymers, polyvinylidene difluoride, copolymers incorporating such polymer types, and combinations thereof. These polymers may be substituted or unsubstituted.

The polymer network may comprise linear polymer chains, or may contain a given density of cross-linking groups in order to provide a cross-linked polymer network. These crosslinks may be, for example, based on covalent bonds, ionic bonds, polar covalent bonds, chemical bonds, physical bonds, dispersion interactions, Van Der Waals interactions, nanoparticle interactions, surface interactions, hydrogen bonds, coordination bonds, electrostatic interactions, hydrophobic interactions, fluorophobic interactions, phase-separated domains, or combinations thereof. The density and distribution of crosslinks throughout the polymer may be selected to provide the polymer with certain stiffness or flexibility. For example, a higher density of crosslinks may result in a stiffer polymer material and may result in a smaller and/or slower response to external stimuli. The crosslinks may also be electrically conductive or electrically insulating.

The polymer may be incorporated into the layers of the DBR by a variety of methods including but not limited to: melt infiltration, polymerization or crosslinking of a monomer or combination of monomers, polymerization of a crosslinker, solution infiltration, gas-phase infiltration, electrophoresis, sublimation, or combinations thereof.

In an example, the polymer material may be a polyferrocenylsilane bearing pendant vinyl groups, which is crosslinked using a multi-functional thiol in the presence of an activated radical initiator.

In some embodiments, at least one of the two layer materials may be prepared using a mixture of two or more different materials. For example, one of the layer materials may be made of a mixture of two nanoparticles, or a mixture of a nanoparticle and an infiltrated material. This may provide the mixed layer with the ability to respond to an external stimulus, without having to incorporate a responsive material into the layer. For example, a mixed layer may be made using a mixture of nanoparticles of a magnetically responsive material, such as magnetite, and a reversibly compressible material, such as an elastomer. The other layer material may also be mixed or may be homogeneous. Because of the presence of magnetically responsive material in the mixed layer, the resulting structure may be compressed or expanded, drawing the DBR layers closer together or farther apart, in response to a magnetic stimulus, with a resulting change in the reflectance wavelength.

A magnetically responsive DBR may also be achieved without using a mixed layer. For example, the DBR may include alternating layers of a first material having magnetically responsive material, such as magnetite nanoparticles, and a second material that is reversibly compressible, such as a porous elastomer. The magnetite layers are thus separated by porous elastomers layers which may be deformed (e.g., compressed) as the magnetite layers respond to a magnetic stimulus.

In some embodiments, the responsive material may be responsive to a mechanical stimulus. For example, one or more of the DBR layers may include a mechanically expandable/compressible material, such as a porous elastomer or polymer, which may enable the DBR structure to be deformable by a mechanical stimulus (e.g., compressible by application of a mechanical force).

Figure 3:
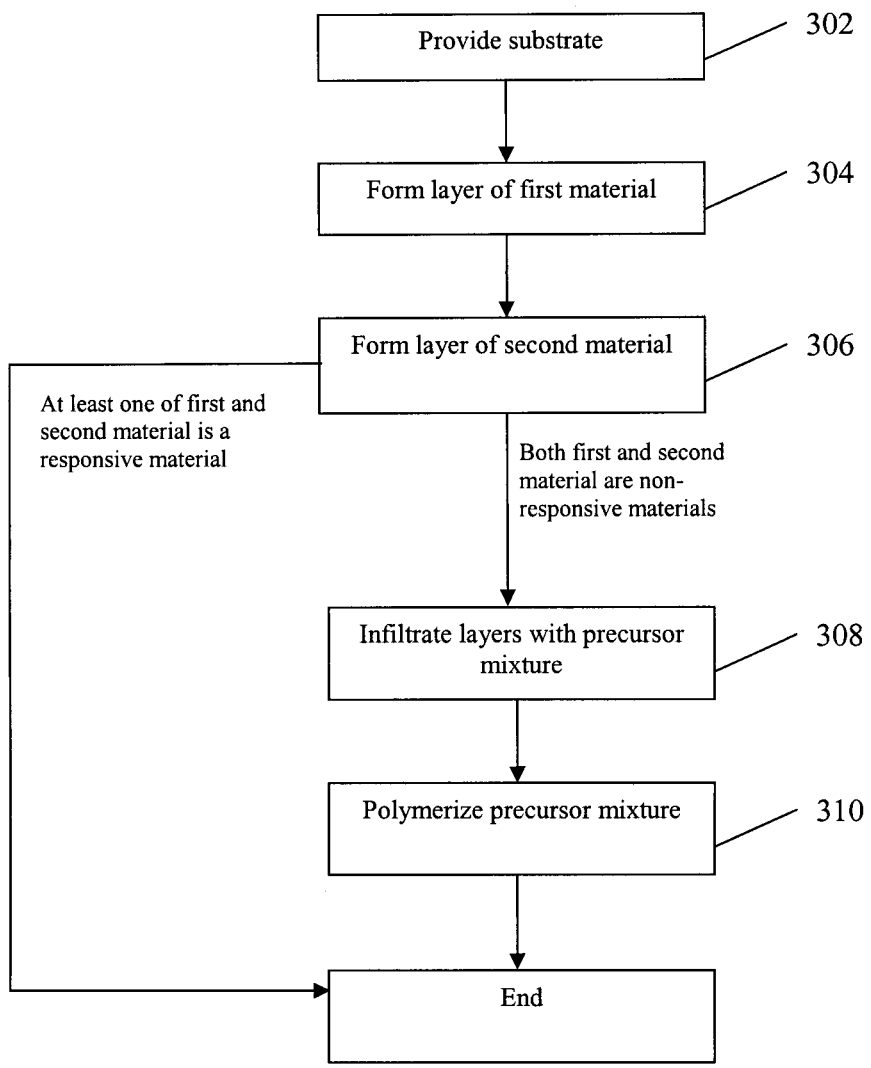
FIG. 3 is a flowchart illustrating a method of manufacturing a tunable DBR.

An example method of manufacturing the tunable DBR is illustrated in FIG. 3.

At step 302, a substrate is provided, on which the layers of the tunable DBR are formed. The substrate may be made of a flexible or inflexible material, and may be chosen depending on the application. Possible materials for the substrate include: metals, insulators, semiconductors, semimetals, polymers, liquid crystals, ionic liquids, liquids, and combinations thereof. Although not shown, the substrate may be later removed after the tunable DBR is manufactured, using techniques commonly known in the art, to create a free-standing tunable DBR. It may also be possible to form the layers of the DBR without the use of a substrate. For example, instead of a substrate, an already-formed initial layer (e.g., formed separately using any conventional means) may be used. Such an already-formed layer may be incorporated into the DBR as one of its alternating layers, such as a top or bottom layer. Such an already-formed layer may also be incorporated as a core or central layer, for example by forming alternating layers around the initial layer, using any of the techniques described here.

At step 304, a layer of the first material is formed on the substrate. The layer may be formed of a variety of materials and have a variety of geometries, as described above. In the case where the layer is a nanoparticle layer, this step might include spin-coating nanoparticles to form a thin, even layer. Other methods of controlling the thickness of the nanoparticle layer include dip-coating, drawbar, slot die-coating, curtain-coating, garnier-coating, roll-coating, screen printing, aerosol deposition, vacuum deposition, flame pyrolysis, and other techniques commonly known in the art. In the case of a nanoparticle layer, the layer could be further treated, for example by sintering, thermal treatment or plasma treatment, to produce a more robust layer.

The method of forming this layer may be similar when the first material is a mixed material (e.g., a mixture of two or more different nanoparticles, or a mixture of nanoparticles and infiltrated material). For example, rather than starting with homogeneous nanoparticles, a mixture of two or more different nanoparticles may be used, having a certain appropriate proportion of each nanoparticle, and the mixture may be made into a layer using the techniques described above, such as spin-coating. The mixture may include a nanoparticle that is responsive to external stimulus, such as a magnetically responsive nanoparticle (e.g., magnetite nanoparticles). The formed mixed layer may be further infiltrated with an infiltrated material and the non-responsive nanoparticles may be selectively removed. The non-responsive nanoparticles may be selectively removed as each mixed layer is formed, or may be removed after all layers of the DBR have been formed. For example, this method may be used to form a magnetically-responsive mixed layer by first forming a layer using a mixture of $SiO_2$ and magnetite nanoparticles in an appropriate portion, infiltrating the formed layer with an elastomer, then selectively removing the $SiO_2$, resulting in a mixed layer that contracts or expands in response to magnetic stimulus.

In another example, the $SiO_2$ and magnetite nanoparticles may also be present in different layers, with a reversibly compressible material, such as an elastomer network, being embedded in the $SiO_2$ layer, such that after etching of the $SiO_2$, the magnetite layers would be separated by porous elastomers layers which may be deformed (e.g., compressed) as the magnetite layers respond to a magnetic stimulus.

At step 306, a layer of the second material is formed. The second layer may be formed of a variety of materials and have a variety of geometries, as described above. The layer of second material may be formed in the same way as the layer of first material. Where the first material is a mixed material, the second material may be a homogeneous material, or may also be a mixed material, having a similar or different responsive material.

Alternating layers of first and second material are repeatedly formed until the desired number of layers or thickness is achieved. There may be an equal number of layers of the first material to the second material (i.e., in the case where there is an even number of layers), or there may be one more layer of the first material than the second material (i.e., in the case where there is an odd number of layers).

Where at least one of the first and the second material is a responsive material, such as a mixed material having at least one embedded responsive component, the DBR may be complete at this point and the method ends. Where both the first and the second material are non-responsive, the method may proceed to step 308.

At step 308, the layers are infiltrated with a precursor mixture. The precursor mixture may comprise a monomer, oligomer or pre-polymer; a cross-linking agent; and an initiator. In some examples, the precursor mixture may comprise about 50-100 weight % monomer, oligomer or pre-polymer, 0-30 weight % crosslinker, and 0-20 weight % initiator. Infiltration into the layers may be aided by vibrations, heat, vacuum, and other similar known techniques. The monomer, oligomer or pre-polymer may include the monomers of the polymers described above. The initiator may be selected from a photoinitiator, a heat-sensitive initiator, or a chemical initiator. The monomer, oligomer or pre-polymer itself may include cross-linking groups or side-chains, in which case a cross-linking agent may not be necessary.

At step 310, the precursor mixture is crosslinked to form a polymer network, thus creating a composite DBR. Crosslinking may include exposing the precursor mixture to UV radiation, heat, or suitable chemicals (e.g., in liquid or gas form), depending on the type of initiator used.

In some embodiments, the process of electropolymerization may be used for infiltrating the layers with electrically conductive polymers, such as organic conducting polymers, to produce an electrically responsive DBR.

Figure 15:
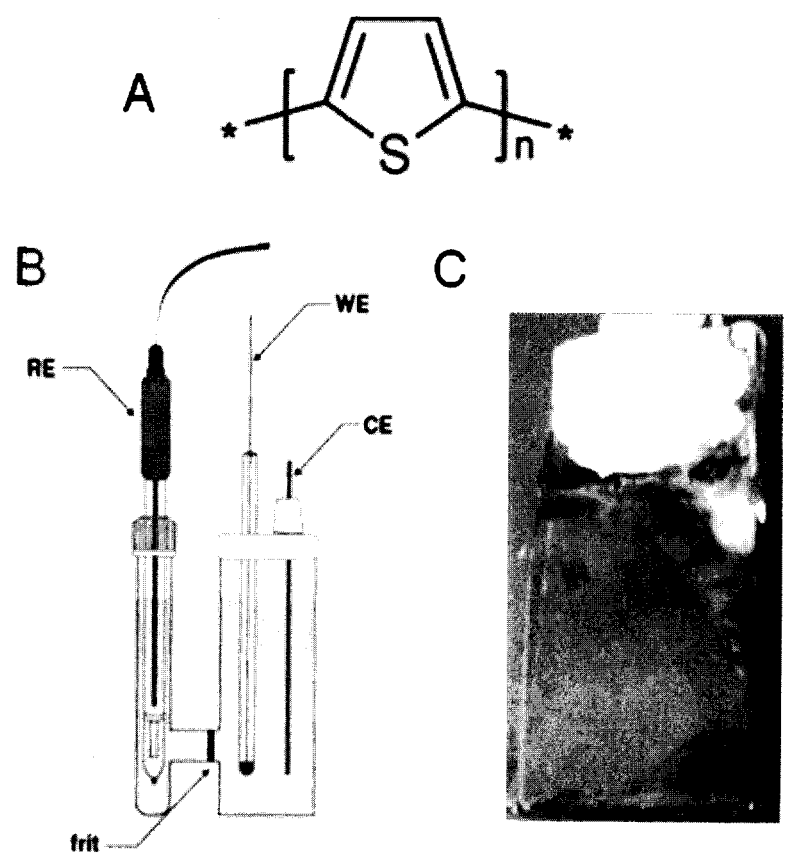
FIG. 15 shows an example of an electropolymerization process.

An example of an electropolymerization process is shown in FIG. 15. In this example, the electrically conductive polymer is thiophene, shown in A. B schematically illustrates a three-electrode electrochemical cell suitable for electropolymerization. In the example shown, the cell has a working electrode WE comprising the formed layers on fluorine doped tin oxide (FTO), a platinum counter electrode CE, and a silver/silver chloride reference electrode RE immersed in a solution containing the polymer precursor, in this example the thiophene monomer. Other suitable materials may be used for the electrodes and solution, and other electrochemical setups may also be suitable. A suitable positive potential may be applied to the working electrode, to oxidatively polymerize the precursor to the desired polymer. Alternatively, certain polymer precursors may be electropolymerized by applying a negative potential to the working electrode. Because the working electrode consists of the porous DBR, the polymer only grows within the pores of the DBR. C is a photograph of an example poly(thiophene) infiltrated $SiO_2/TiO_2$ DBR. D includes the reflectivity spectrum of the example $SiO_2/TiO_2$ DBR before and after infiltration with poly(thiophene).

The finished composite DBR may be used on the substrate or it may be freed from the substrate, for example by floating the DBR off the substrate in distilled water. Providing the DBR without a substrate may be useful where greater flexibility is desired. Robustness of the DBR without a substrate may be improved by forming more layers or thicker layers in the DBR. Sintering, thermal treatment or plasma treatment may also help increase the robustness of the DBR.

Figure 4:
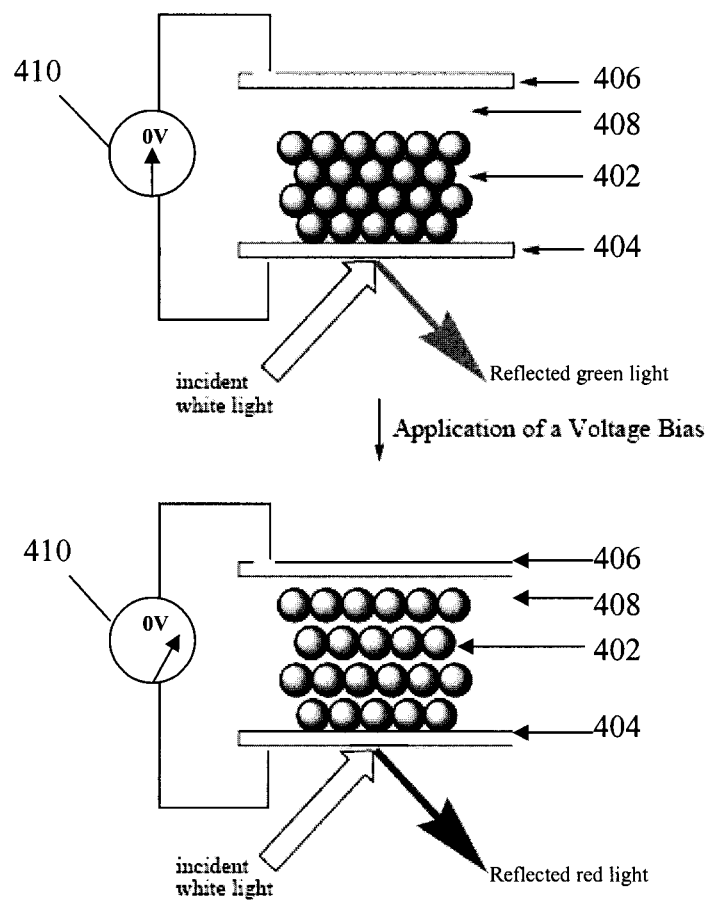
FIG. 4 is a schematic diagram of an electrochemical cell having a tunable DBR.

In some examples, the DBR may be further etched to remove one or more of its layers. This may be done to improve its responsiveness and/or to modify its response to an external stimulus. This etching may be selective, and may be done by chemical treatment (e.g. hydrofluoric acid, ammonium fluoride, or sodium hydroxide etching of silica), plasma treatment (e.g. an oxygen plasma to remove organics such as sacrificial polymer sphere that have been blended), gas treatment, or thermal treatment (e.g., thermal conversion of organics to carbon dioxide gas), as appropriate. The etching process may be used to remove one or more layers of the DBR, which may allow the remaining layers to exhibit greater changes in dimension (e.g., expansion/contraction), and may increase the intensity of the reflectance wavelength.

Where the tunable DBR is electrically tunable, it may be incorporated into an electrochemical cell, as shown in FIG. 4. The electrochemical cell includes the tunable DBR 402, which may be supported on a working electrode 404, and a counter electrode 406 spaced from the working electrode. The working electrode and the counter electrode may be spaced apart by a spacer (not shown). A conductive solution 408, such as an ionically conductive electrolyte solution, may be provided between the electrodes 404, 406, providing electrical communication among the electrodes 404, 406 and the DBR 402, and the solution 408 may contain electrolytes to enable the DBR to respond to electrical stimuli. The cell may be sealed to contain the solution 408. Although referred to as a solution 408, a solid or liquid may be used to provide electrical communication in the cell. The electrochemical cell may be mounted on a substrate for greater robustness.

The device may be connected to an electrical source, such as a potentiostat 410, to control the device. In this form, the reflectance spectrum of the device may be tuned by applying an electrical potential across the working electrode 404 and counter electrode 406. For example, where the DBR 402 comprises an electrically responsive polymer, when an oxidative potential is applied to the device, electrons are drawn out of the polymer in the DBR layers 402, such as when the polymer is a metallopolymer gel containing metal atoms, while anions from the conductive solution 408, surrounded by a solvent shell, may be driven into the polymer to neutralize the positive charge build-up. The influx of electrolytes and solvent into the polymer causes swelling of the polymer, pushing apart the layers in the DBR 402, resulting in a red-shift of the reflected wavelength. Applying a reducing potential causes the reverse effect, with electrons docking onto the polymer in the DBR 402 and anions being expelled into the conductive solution 408. This causes the polymer to contract, decreasing the spacing between layers in the DBR 402, resulting in a blue-shift of the reflected wavelength.

In other examples, the DBR 402 may comprise a responsive material that is responsive in other ways, such as by a change in the refractive index. Such a change may also cause a shift of the reflected wavelength, without changing the physical periodicity (e.g., the geometric thickness) of the layers in the DBR 402.

The working and counter electrodes 404, 406 may be made of the same material and have substantially the same design. Alternatively, the working and counter electrodes 404, 406 may be made of different materials and/or have different configurations. The material and/or configuration of the working and counter electrodes 404, 406 may affect the electrical response of the DBR 402 as described below.

In general, materials and configurations suitable for the working electrode 404 may also be suitable for the counter electrode 406. As such, construction of the two electrodes 404, 406 will be discussed together. Suitable materials for the electrodes 404, 406 may include various electrically conductive materials including but not limited to conductive oxides, conductive ceramics, metals, carbons, conducting polymers, redox-active polymers, nanoparticles, and combinations thereof. Other suitable electrically conductive materials may be used. These electrically conductive materials may be free-standing, or may be supported on an electrode substrate. Such an electrode substrate may be made from materials including but not limited to fabrics, papers, metals, polymers, glasses, ceramics, inorganic materials, and combinations thereof. The electrodes 404, 406 and the electrode substrate may be chosen to be flexible.

The electrodes 404, 406 may be coated with a charge-storage material (not shown). A charge-storage material may also be present within the ionically conductive electrolyte. Depending on its capacity to hold charge, as well as on its own electrical and electrochemical properties, the charge-storage material may influence the nature and magnitude of the changes in the optical characteristics of the DBR 402.

Such charge-storage materials may consist of various materials including but not limited to conductive oxides, conductive ceramics, metals, carbons, conducting polymers, redox-active polymers, nanoparticles, redox-active small molecules, and combinations thereof. The charge-storage material may be fully dense, or may be porous; it may be relatively smooth or rough. The charge-storage material may range from very good to relatively poor conductivity. The charge-storage material may undergo a chemical change (e.g., redox reaction, intercalation, etc.) in order to store a charge, or it may be storing charge at its surface, in which case a greater surface area (e.g., in the case of a porous material) may provide greater charge capacity. The charge-storage material may be deposited on one or both of the electrodes 404, 406 by known methods, such as using liquid deposition (e.g., dip coating, curtain coating, slot die, screen printing, gravure coating, meyer bar coating, spray coating, etc.), from gas-phase deposition (e.g., thermal evaporation, sputtering, spray pyrolysis, chemical vapor deposition, nanoparticle aerosol, etc.), or solid-phase deposition (e.g., extrusion, drawing, melt forming, etc.). These methods may be adapted to printing or coating of patterns with predefined thicknesses. The charge-storage material may also be made separately and then attached to the electrode.

The charge-storage material may also be provided in the conductive solution 408. For example, the solution 408 may contain a dissolved species, such as silver ions. Such a species may be reduced when the electrochemical cell is connected to a charge, effectively storing the charge. This may be reversed as the charge changes. The solution 408 may contain other electroactive components that may undergo a chemical or electrochemical reaction at the working or counter electrodes 404, 406.

Figure 5:
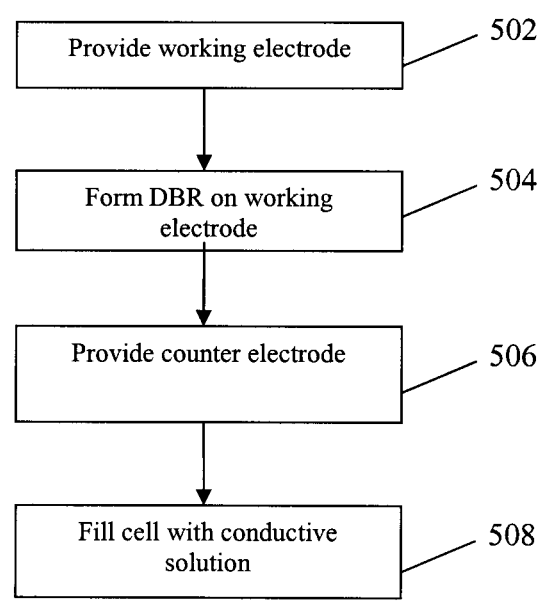
FIG. 5 is a flowchart illustrating a method of manufacturing an electrochemical cell incorporating an electrically tunable DBR.

A method of manufacturing the electrochemical cell including the tunable DBR is illustrated in FIG. 5.

At step 502, a working electrode is provided. The material for the working electrode may be selected from the materials described above, and may include: conductive oxides, conductive ceramics, and carbon (e.g., graphite, amorphous carbon, carbon nanotubes, fullerenes, graphenes, or composites thereof with polymers). The working electrode may be mounted or provided on a substrate for increased robustness. The substrate may be flexible, for example where the electrode is also flexible. Typically, a substrate may provide mechanical stability. The working electrode may also be provided with a charge-storage material, which may be formed as described above.

At step 504, the tunable DBR is fabricated on the working electrode. Although this method describes fabricating the tunable DBR directly on the working electrode, the tunable DBR may also be fabricated separately and then mounted, adhered, or placed on the working electrode. The tunable DBR may also be partially fabricated separately (e.g., formation of the nanoparticle layers but not crosslinking), and fabrication may be completed (e.g., infiltration of the precursor mixture and crosslinking) on the working electrode. There are a number of different ways to achieve the result of a tunable DBR on the working electrode, which may be selected depending on the application, as known in the art.

At step 506, a counter electrode is provided and the working electrode is connected to the counter electrode. The counter electrode may be provided spaced apart from the working electrode, for example by inclusion of a spacer. The material for the counter electrode may be selected from the same materials as described above for the working electrode. The counter electrode and the working electrode may be made of the same material. The description for the working electrode at step 502 may be similarly applicable to the counter electrode.

Although the tunable DBR has been described as being supported on the working electrode, the tunable DBR may alternatively be supported on the counter electrode. The tunable DBR may also be free-floating between the working and counter electrodes, and may be in electrical contact with the electrodes via a conductive solution between the electrodes rather than by direct contact.

As described above, spacer may be introduced between the working and counter electrodes. Materials for the spacer may be selected from non-conductive material such as thermoplastic polymer films, adhesive-coated plastic films, adhesives or epoxies deposited with a controlled thickness, or spacer beads which define the thickness of the cell mixed into an adhesive or an epoxy.

The counter electrode is electrically connected to the working electrode, either directly (e.g., using a wire) or indirectly (e.g., via a conductive solution).

At step 508, the cell is filled with a solution such as an ionically conductive solution containing electrolytes or ions. The electrolytes or ions may be selected to be suitable for swelling the polymer in the tunable DBR. One or more areas of the cell may then be sealed. Electrolytes typically consist of a salt (i.e., an anion and a cation) dissolved in a liquid or a gel. The salts may be chosen so that they are not electroactive in the potential range that will be applied to control the tunable DBR. For example, lithium salts such as lithium triflate and lithium haxafluorophosphate may be suitable. The salts may be dissolved in a liquid having which is similarly inactive in the potential range being employed.

Although not shown, the cell may be further provided with electrical connections, via which an electrical stimulus may be provided.

Although this method is described with steps in a certain order, variations on this method are possible (e.g., different order of steps, manufacture of more than one component in one step, etc.) and such variations and modifications are included within the scope of this disclosure.

EXAMPLE

An example of an electrically tunable DBR is a composite polyferrocenylsilane/nanoparticle DBR. This DBR includes alternating layers of different nanoparticle layers, which are infiltrated with a polyferrocenylsilane (PFS) material. Such a structure may be used in an electrochemical cell by first fabricating the composite DBR on a conductive electrode (e.g., fluorine-doped tin oxide, which may be transparent) followed by subsequent integration of the DBR and its electrode into an electrolytic electrochemical cell.

$SiO_2$ and $TiO_2$ are two materials that may be used to build DBR structures. These two materials possess different dielectric constants and can also be grown as highly uniform thin films using a wide variety of techniques such as pulsed laser deposition, reactive sputtering, or different types of chemical vapour deposition techniques (Jethmalani et al., *Langmuir* 1997, vol. 13 p. 2633). Also, sol-gel methods combined with dip (Chen et al., *Appl. Phys. Lett.* 1999, vol. 75 p. 3805) or spin-coating (Almeida et al., *Current Opinion in Solid State and Materials Science* 2003, vol. 7 p. 151) may be used. Pulsed laser deposition, reactive sputtering, or chemical vapour deposition techniques typically provide continuous nonporous films, which may have less functionality than porous films. Nonporous continuous films may also be prepared from sols (e.g., using the sol-gel method) deposited by dip- or spin-coating. For a porous film, nanoparticles may be prepared using the sol-gel method. These nanoparticles may then be deposited using spin- or dip-coating, or other similar technique as discussed above, to provide a porous film.

The DBR layers may be fabricated starting with suspensions of nanoparticles of $SiO_2$ and $TiO_2$. The $SiO_2$ colloids used in this example were a product of Dupont (LUDOX™, Aldrich) while the TiO$_2$ crystallites (nc-TiO$_2$) were synthesised using a procedure based on the hydrolysis of titanium ethoxide (Aldrich) in 0.1M HNO$_3$. Peptization of the TiO$_2$ colloids was achieved by refluxing for 8 hrs.

TiO$_2$ nanocrystals were used as prepared (i.e., from stock) or diluted to the desired concentration (here, half the original concentration). To improve the film forming properties of the TiO$_2$ dispersion, 1-2.5 wt. % of polyethylene oxide (Mw=20,000, Aldrich) was added to the TiO$_2$ dispersion. The SiO$_2$ nanoparticles employed were diluted to half the stock concentration. Films were prepared by spin-coating at constant velocity and atmospheric pressure. The spin-coating technique allows the fabrication of nanoparticle layers over a large area. Film thicknesses may be controlled by varying either nanoparticle concentration or spin-coating velocity. Lower spin-coating velocity typically results in a thicker film, and vice versa. Alternatively, increasing the nanoparticle concentration while maintaining the spin velocity also results in a thicker film. Thermal treating the films after every coating step may result in higher quality films. Thermal treating may remove organic compounds, which may have been added to impart better film forming properties to the nanoparticle dispersions, present in the formed film. This thermal treatment may also improve the mechanical properties of the formed film. Similarly, plasma treatments may be used.

The prepared nanoparticle films were then infiltrated with gel precursors, which in this example included a polymer such as poly(methylvinylpolyferrocenylsilane), a crosslinker, and a photoinitiator. Possible materials for the gel precursor include those discussed in U.S. patent application Ser. No. 10/681,374, now U.S. Pat. No. 7,364,673, and Ser. No. 11/831,679, now U.S. Pat. No. 7,826,131, the disclosures of which are hereby incorporated by reference in their entirety. Following infiltration, the composite was sealed in a N$_2$ atmosphere and exposed to UV radiation for 2-4 hrs to complete the crosslinking process. The result of crosslinking was the creation of a polyferrocenylsilane based polymer within the nanoparticle layers. This polymer has a redox response to electrical stimuli, resulting in swelling or contracting of the polymer. A description of the electrical response and properties of this polymer can be found in the above-mentioned U.S. application Ser. Nos. 10/681,374 and 11/831,679. Swelling or contracting of the polymer resulted in increase or decrease in the lattice spacing of the composite DBR. Thus, the composite DBR exhibited electrically tunable color reflectivity stemming from an expansion of the DBR's photonic crystal lattice.

Figure 6A:
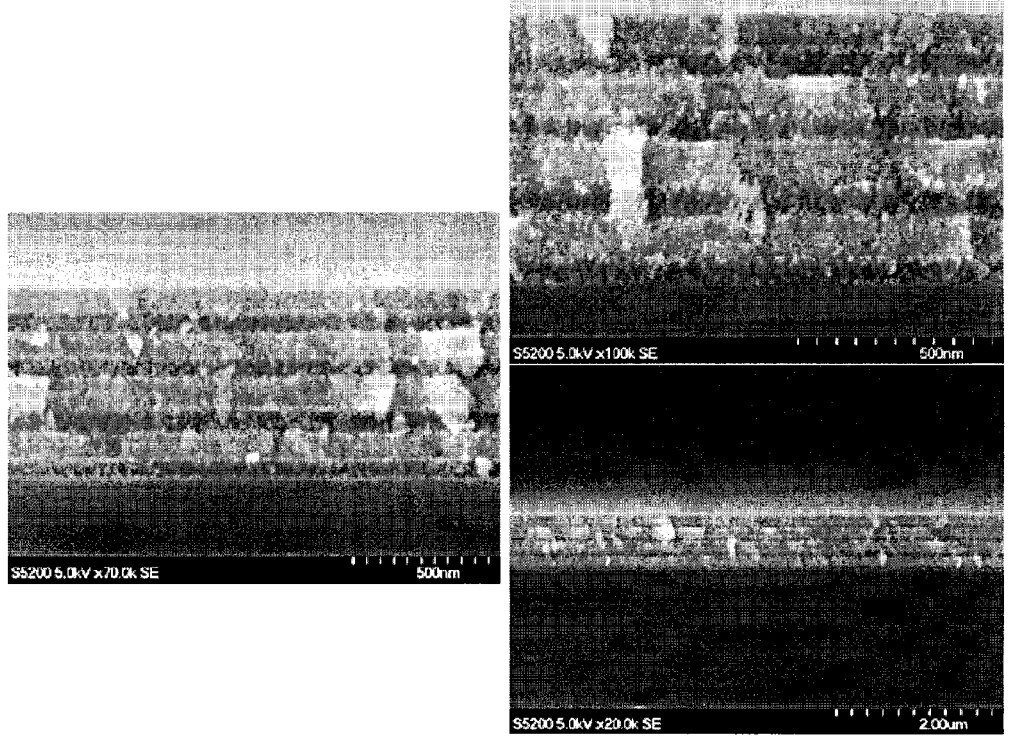
FIG. 6A shows scanning electron micrographs (SEMs) of varying magnification of an example DBR.

Scanning electron micrographs (SEMs) of prepared nanoparticle DBRs are shown in FIG. 6A. Contrast between the alternating layers of the DBR may be seen, with SiO$_2$ corresponding to the darker region and TiO$_2$ the brighter region. The one-dimensional periodicity of the material in the direction normal to the substrate may also be seen as the layer thicknesses and alternating pattern were maintained throughout.

Figure 6B:
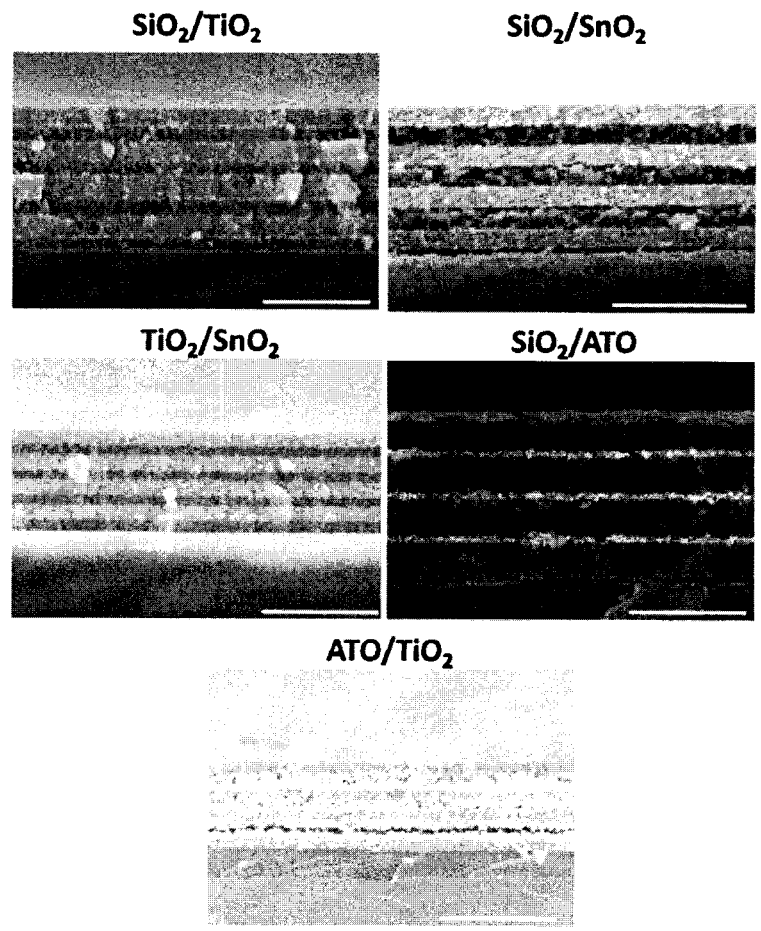
FIG. 6B shows SEMs of some example DBRs.

FIG. 6B shows scanning electron micrographs of some example DBRs. Shown are DBRs prepared from combinations of SiO$_2$, TiO$_2$, Sb:SnO$_2$, and SnO$_2$ nanoparticles. For SiO$_2$/TiO$_2$ the scale bar represents 0.5 μm and for the remaining, the scale bars represent 1 μm. DBRs may be prepared using combinations of these and other various nanomaterials.

Figure 7:
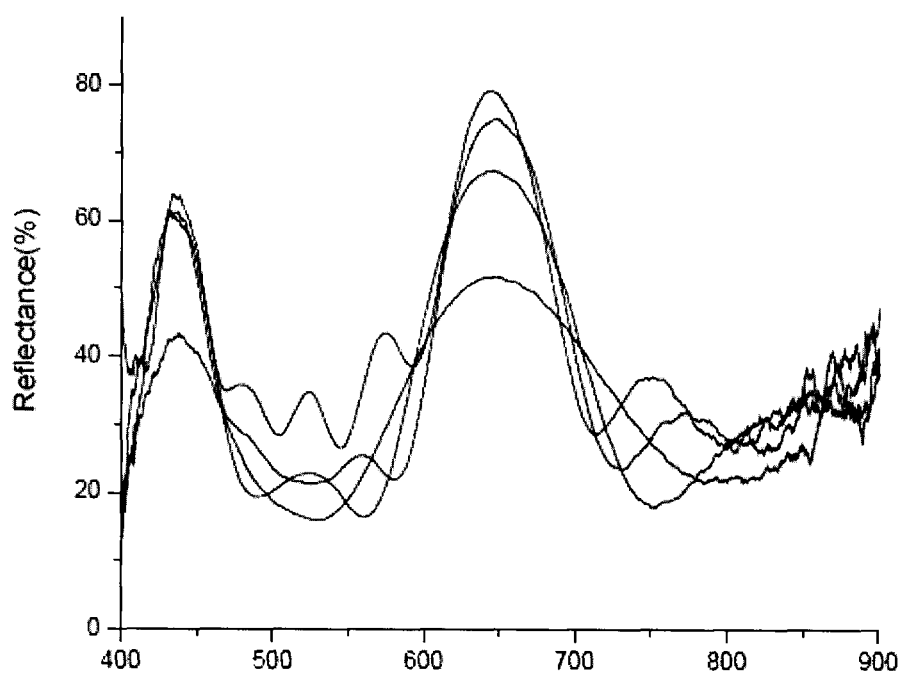
FIG. 7 illustrates quasi-normal incidence reflectivity of a DBR with different numbers of layers.

FIG. 7 illustrates the dependence of the quasi-normal incidence reflectivity of the nanoparticle DBRs on the number of bilayer stacks. In this example, the number of bilayers (i.e. a layer of SiO$_2$ and a layer of TiO$_2$) ranged from 2-5. As is consistent with equation 2 described above, the reflectivity of the DBR was seen to increase as the number of bilayers increased. Such a phenomenon is generally observed with DBRs provided that the layer thicknesses of each material of the stack were maintained periodically throughout the structure.

Figure 8:
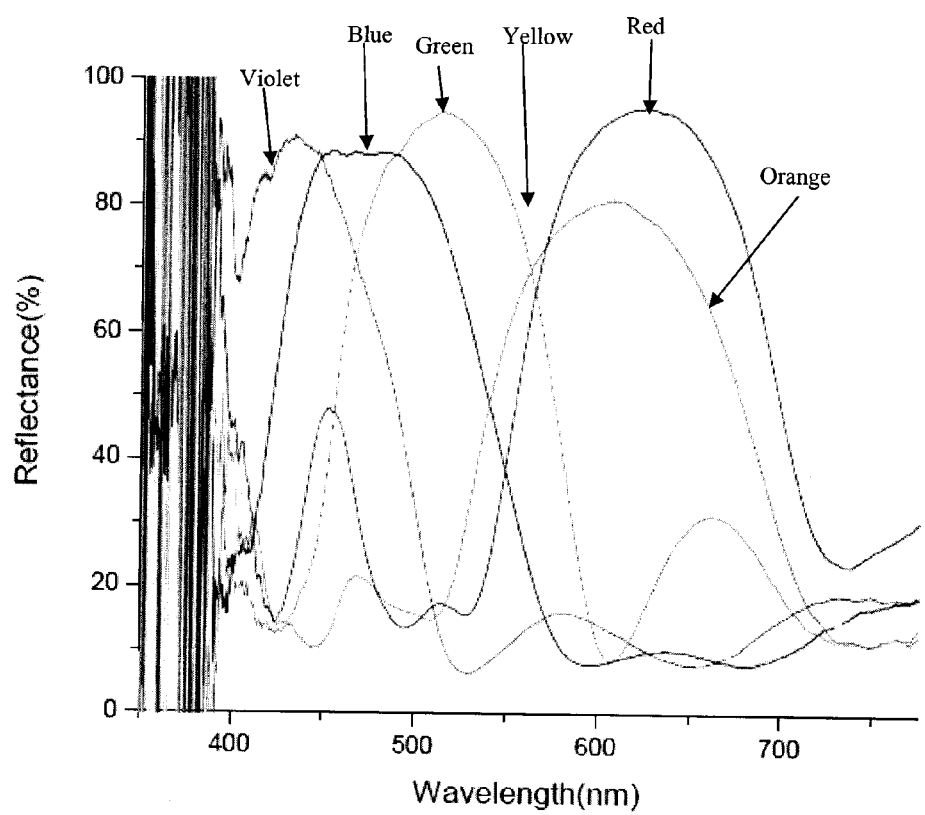
FIG. 8 illustrates the tuning of a tunable DBR.

The reflectivity of DBRs may be tuned by modulating the optical path length of each layer making up the assembly. This may be done by manipulating either the effective refractive index of the layer or the geometric layer thickness. The relatively large porosity of the DBR described here may allow for changes in the geometric layer thickness. FIG. 8 illustrates how the Bragg peak maximum of DBR system may be varied by variation of layer thicknesses. Different thicknesses may obtainable either by simultaneously varying the concentration of the nanoparticles in their respective dispersion and maintaining the spin-rate of the coating process the same or by varying the spin-rate in the coating process and maintaining the concentration the same.

In addition, as shown in FIG. 8, provided the optical thicknesses (i.e., the geometric thickness multiplied by the refractive index of the material) of the layers employed were comparable to the wavelength of visible light, such DBR systems may display visible structural color. FIG. 8 illustrates full color tuning (throughout the entire visible range of the electromagnetic spectrum) of the DBR system achieved by manipulating the layer thicknesses of the DBR. Typically, as thickness is increased, the reflected wavelength undergoes a red shift (i.e., a shift to longer wavelengths).

Figure 9:
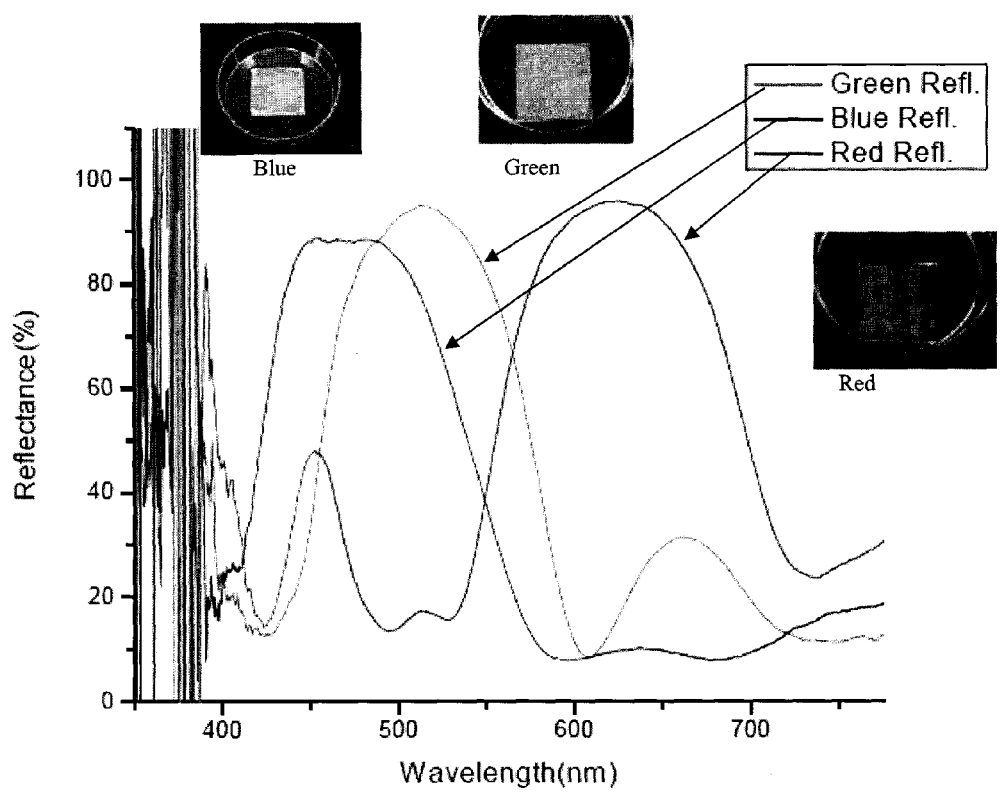
FIG. 9 illustrates a tunable DBR reflecting three primary colors.
Figure 10:
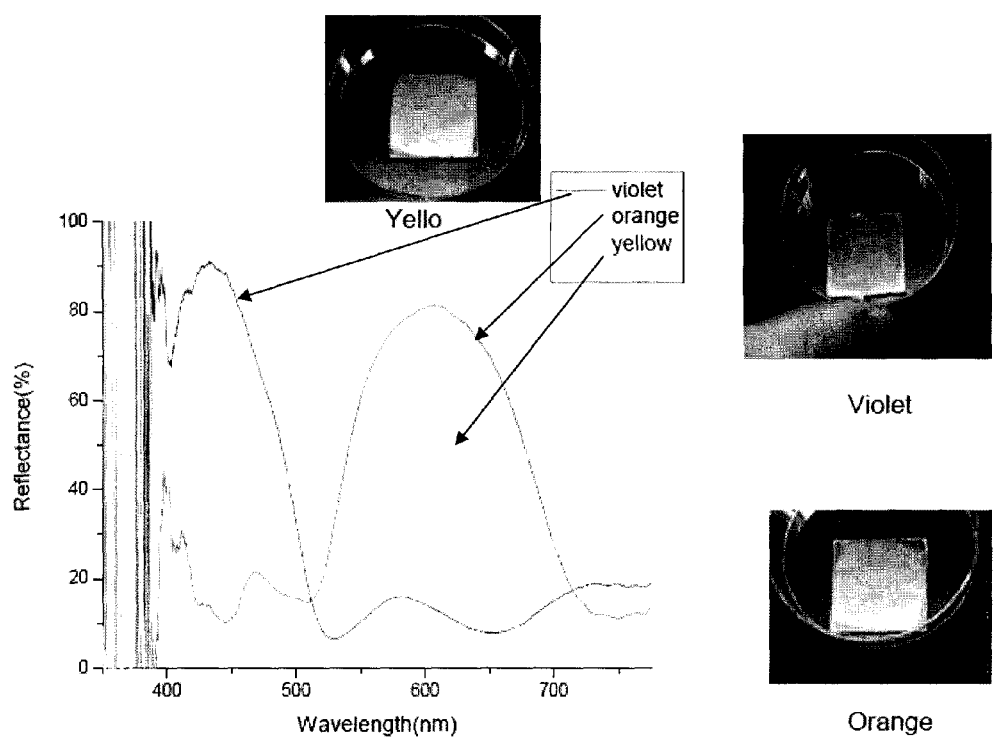
FIG. 10 illustrates a tunable DBR reflecting three non-primary colors.

FIG. 9 illustrates the reflection of the primary colors, red, green, and blue. In addition, FIG. 10 demonstrates the reflection of three non-primary colors, which may not be obtainable from other known photonic crystal systems (Arsenault et al., *Nat. Photon.* 2007, vol. 1 p. 468).

Figure 11A:
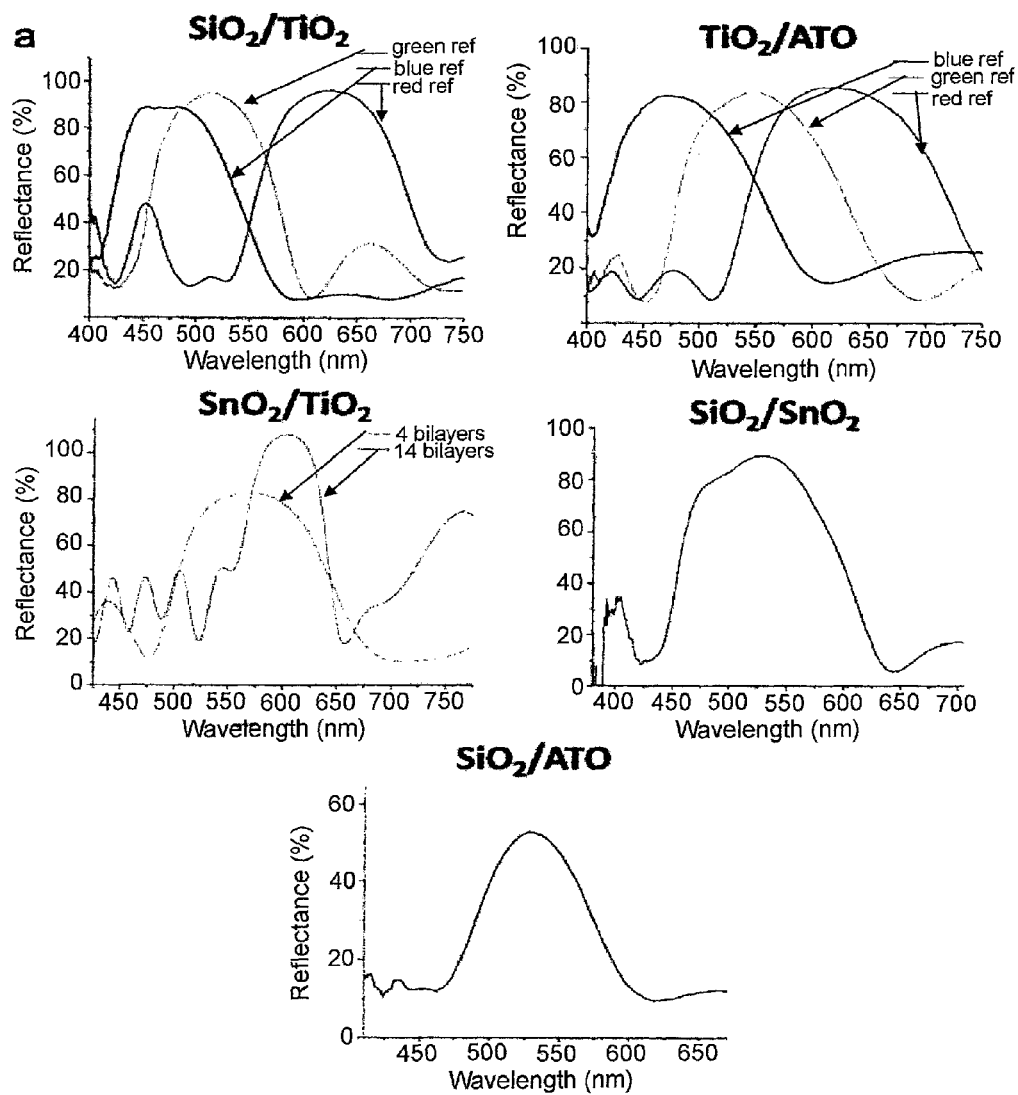
FIG. 11A shows the reflectance spectra of example DBRs.

FIG. 11A shows the reflectance spectra of DBRs made from various combinations of nanoparticle bilayers, namely SiO$_2$/TiO$_2$, TiO$_2$/ATO, SnO$_2$/TiO$_2$, SiO$_2$/SnO$_2$, and SiO$_2$/ATO, where ATO is antimony doped tin oxide. Note in particular the spectrum of the 14-bilayer SnO$_2$/TiO$_2$ DBR compared to that of the 4-bilayer. For some examples, spectra for different layer thicknesses or number of bilayers are provided. For each example, the spectral position of the fundamental Bragg peak may be shifted by manipulating the geometric thicknesses or optical thicknesses of the layers making up the one-dimensional photonic lattice, for example in accordance with the Bragg equation for 1D photonic crystals.

Figures 11B, 11C:
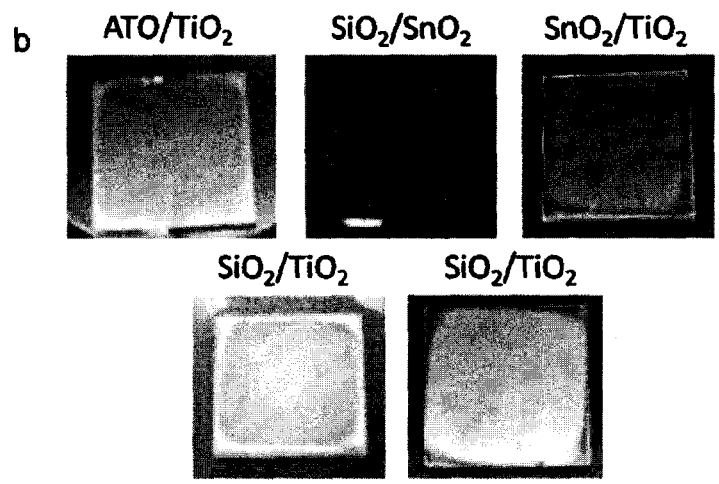
FIG. 11B shows SEMS of the DBRs of FIG. 11A.
FIG. 11C is a table showing analysis of the DBRs of FIG. 11A.

FIG. 11B shows images of 4-bilayer nanoparticle DBRs made using the different compositions discussed above, on glass substrates.

FIG. 11C is a table showing analysis of the examples of FIG. 11A. The table shows the dispersion compositions and spectroscopic ellipsometry analysis of the example DBRs. Spectrocopic ellipsometric porosimetry (SEP) may be a useful tool for characterizing DBRs, as SEP may allow determination of the effective refractive index as well as the geometric thicknesses of the alternating layers of a given DBR. The product of these parameters yields the optical thickness (e.g., optical thickness of a TiO$_2$ layer=$n_{eff}$ (TiO$_2$)×thickness (TiO$_2$)) which as indicated by the eqns. 1 and 2 above, may determine the optical properties of the DBR. SEP may also provide the amount of free volume present (i.e., the porosity) in the layers of the DBR which may be useful as it is this porosity which may allow for the incorporation of a range of functional materials (e.g., responsive material) into the free volume of the DBR. Although the table shows certain values and dimensions, a range of values and dimensions may be suitable, and these examples are shown only for the purpose of illustration.

The void interstitial volume of the nanoparticle DBR system may present an opportunity to impart a degree of functionality to the DBR as these voids may allow for infiltration with functional and/or responsive materials. The term "responsive" refers to materials that can undergo a particular transformation in response to an external stimulus. Materials of this nature may also be referred to as being "intelligent". Such materials may be used to provide a photonic crystal device whose color may be reversibly tuned, such as a tunable DBR. The tunable wavelength range may be wide, and may cover ultraviolet, visible, or infrared wavelengths, or a combination thereof.

Figure 12A:
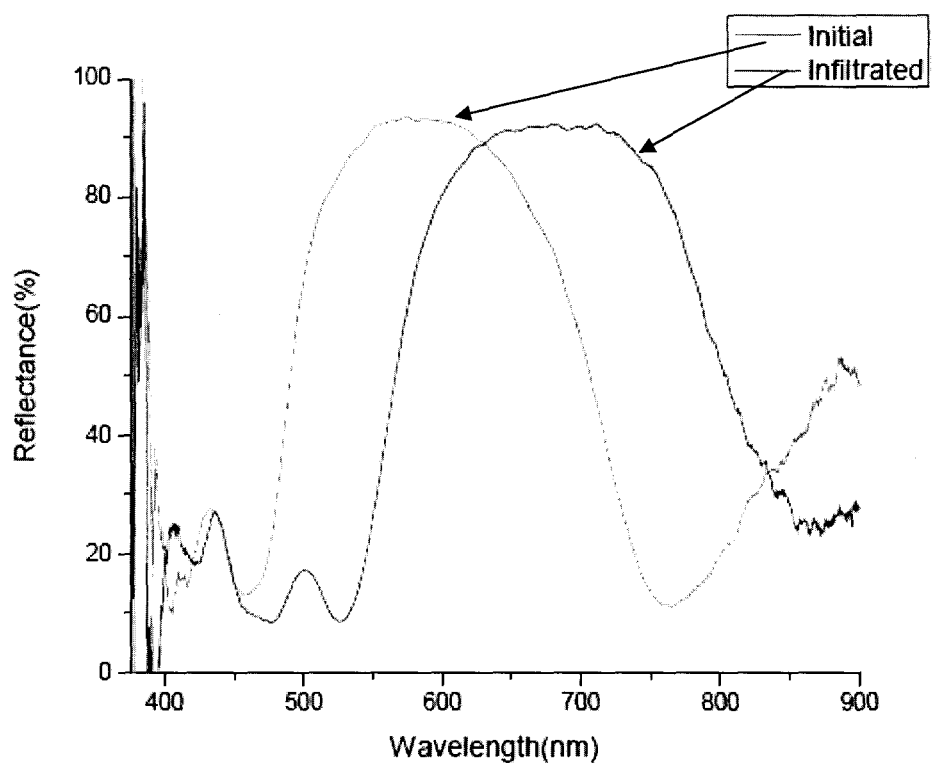
FIG. 12A illustrates the effect of PFS gel infiltration on reflectance of an example DBR.

In an example, the DBR was infiltrated with a responsive polymer gel such as polyferrocenylsilane (PFS). This gel was also discussed in U.S. patent application Ser. Nos. 10/681,374 and 11/831,679. FIG. 12A illustrates the effect of infiltration of a PFS gel on the Bragg reflection of the DBR device. As shown, a decrease in intensity of the Bragg peak along with a 70 nm red shift in the reflection wavelength was observed following infiltration.

Figure 12B:
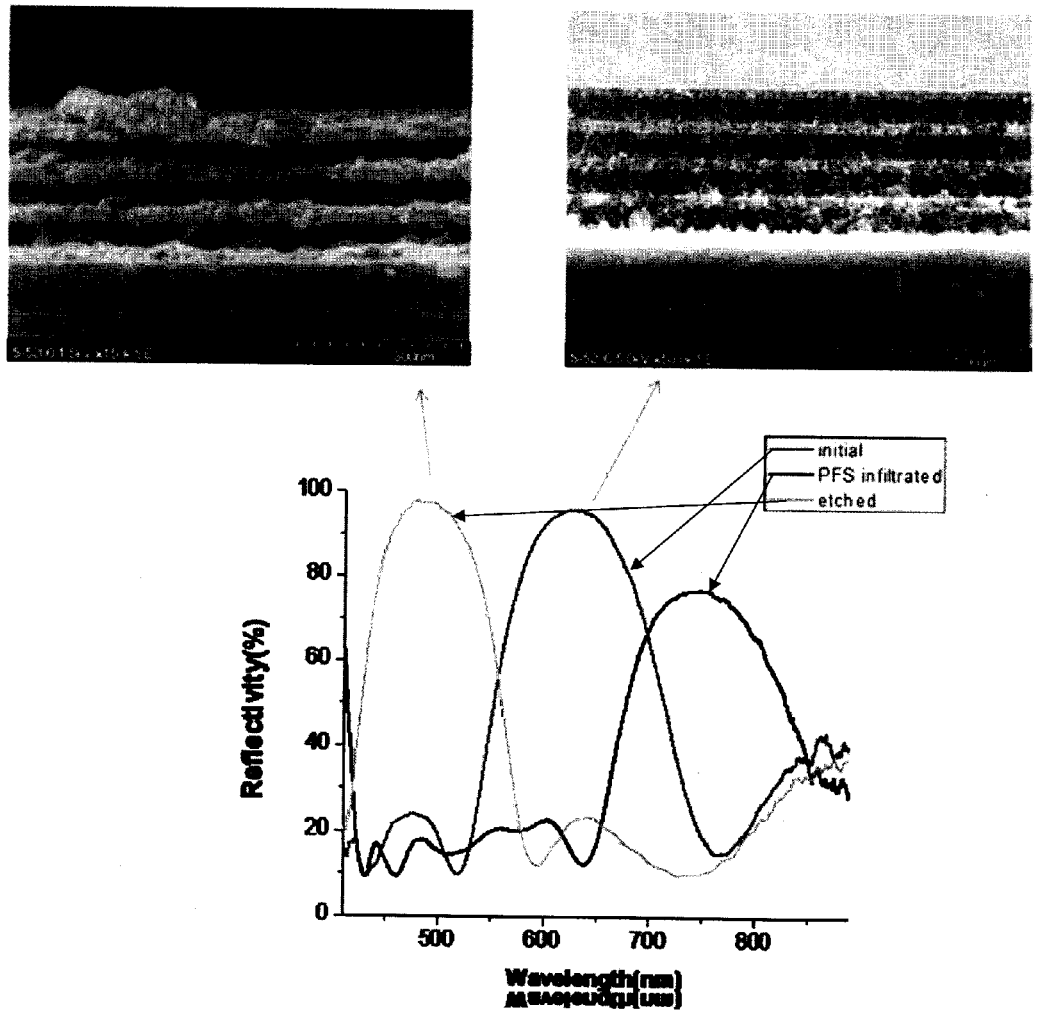
FIG. 12B shows the spectra and images of an example DBR.

FIG. 12B shows the spectra of an example porous $SiO_2$/$TiO_2$ DBR and images of the DBR. The red plot corresponds to a porous $SiO_2$/$TiO_2$. The black plot corresponds to the same $SiO_2$/$TiO_2$ DBR which has been infiltrated with a responsive material, in this case polyferrocenylsilane. The $SiO_2$ layers of the infiltrated $SiO_2$/$TiO_2$ DBR may be etched out yielding now alternating layers of porous polymer and $TiO_2$. The reflectivity spectrum of this etched sample is shown in green.

An example of an electrochemical cell incorporating an electrically tunable DBR was also fabricated. In this example, the electrochemical cell was a conventional two-electrode cell. The working electrode included an example PFS infiltrated DBR deposited on a conductive material such as ITO (Tin doped Indium Oxide), and the counter electrode included another conductive material such as unmodified FTO (Fluorine doped Tin Oxide). This electrochemical cell exhibited a continuously variable degree of oxidation due to the redox properties of its metallopolymer network. The polymer in the DBR film may be oxidized to different degrees (e.g., conversion of Fe(II) to Fe(III) in the case of PFS) by polarizing the working electrode of the electrochemical cell positively with respect to the counter electrode, thus inducing variable degrees of swelling of the PFS gel. This swelling altered the periodicity of the DBR layers and thus affected the reflected wavelength.

Figure 13:
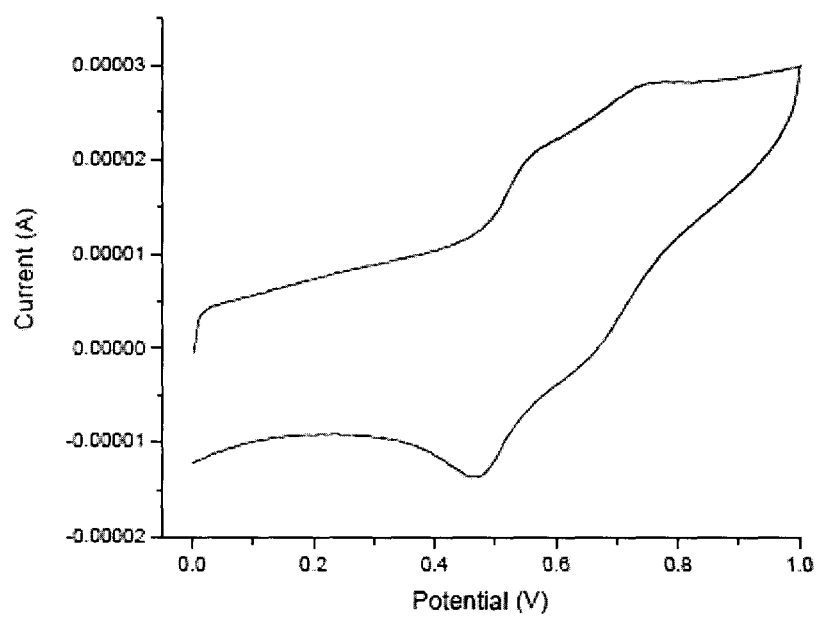
FIG. 13 is a graph illustrating the reversibility of an electrochemical cell incorporating an electrically tunable DBR.

In order to confirm that the polymer was electrically accessible as well as active within the DBR framework, cyclic voltammetry, which is a method whereby the voltage applied to the sample is varied at a constant rate up to a certain maximum potential and then reversed to the original potential with the current being monitored throughout the potential cycle, was performed. As is shown in FIG. 13, the polymer was reversibly redox active as the two characteristic, reversible redox couples of PFS were observed in the CV experiment.

Figure 14A:
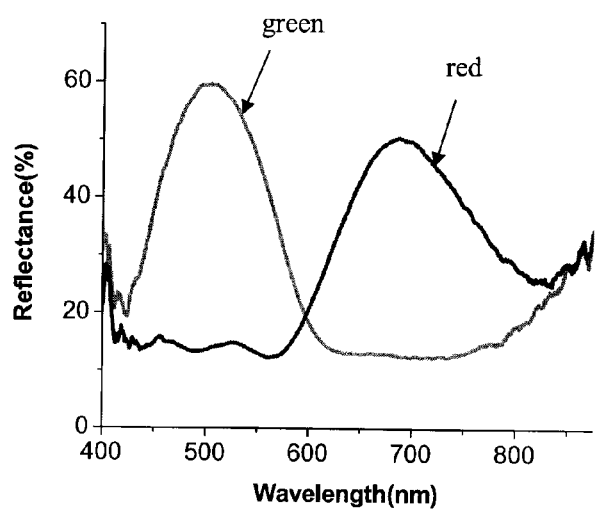
FIG. 14A shows a reflectivity spectrum of an example DBR.
Figure 14B:
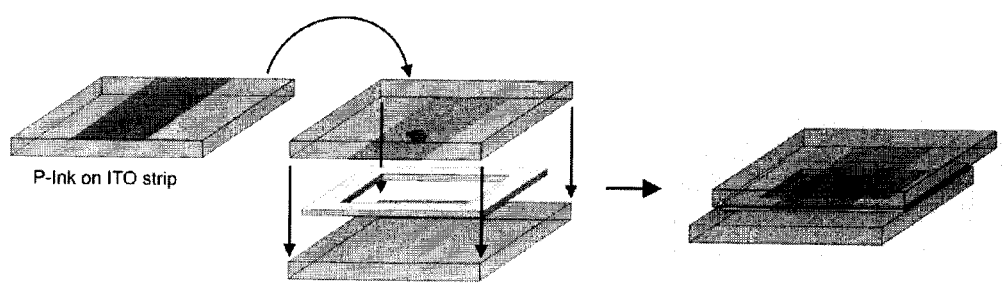
FIG. 14B schematically illustrates an example electrochemical cell used for the example of FIG. 14A.

FIG. 14A shows a reflectivity spectrum of an example DBR in response to an electrical stimulus. In this example, the DBR is a $SiO_2$ etched PFS infiltrated $SiO_2$/$TiO_2$ DBR. The green plot shows the reflectivity spectrum of the DBR with no electrical stimulus. The red plot shows the reflectivity spectrum of the DBR following application of 2000 millivolts for 10 seconds. FIG. 14B schematically illustrates the electrochemical cell used for the example of FIG. 14A.

Figure 16:
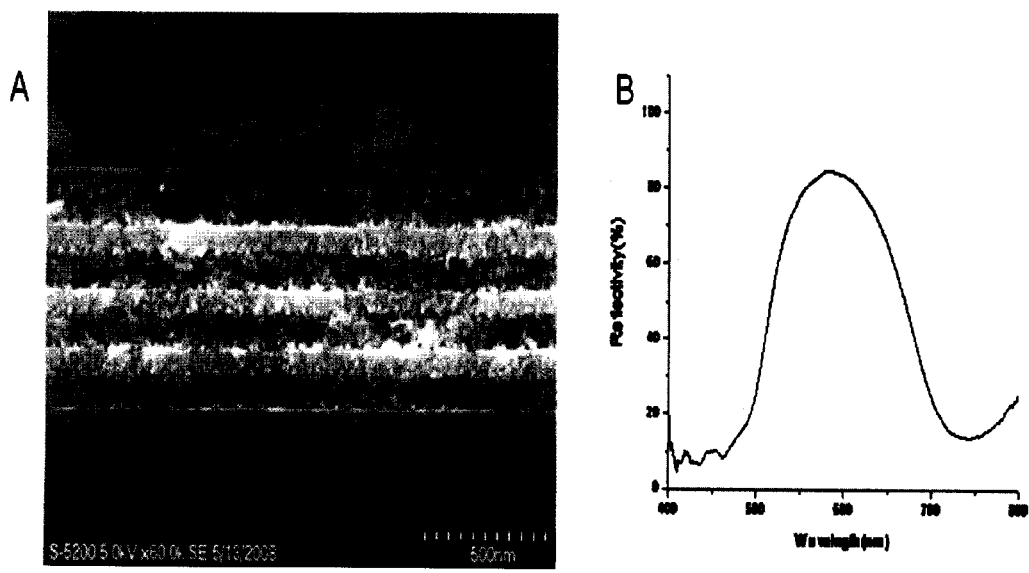
FIG. 16 is an example of a magnetically responsive DBR and its reflectance spectrum.

An example of a magnetically responsive DBR is shown in FIG. 16. A) shows a SEM of an example DBR formed from alternating layers of a first mixed material of $SiO_2$ and magnetically responsive magnetite, and a second material of $TiO_2$. The introduction of magnetite may provide the DBR with magnetic responsiveness. The DBR shown in A) may be infiltrated with an elastomer and subsequently the $SiO_2$ may be etched away. The resulting composite may compress or expand in response to a magnetic stimulus, resulting in structural changes that may give rise to changes in the reflectance spectrum. B) shows the reflectance spectrum of the DBR before etching. In this example, the $SiO_2$ may be sacrificial, and its removal may allow the structure to expand and contract. The removal of $SiO_2$ may effectively disconnect the nanoparticle layers from each other, allowing for expansion and contraction Possible applications for the tunable DBR and the electrochemical cell containing the tunable DBR, as described above, include use in a display device. Such display devices may include electrical signage, display screens, electronic paper, building panels, tiling, casings (e.g., for mobile devices or computing devices), coatings, and camouflage. The display devices could be flexible or rigid, and could be designed to be robust, depending on the application.

Many tunable DBR may be provided in an array of individually-controlled DBRs, for example to result in a pixel display. Tunable DBRs may also be provided stacked atop each other. Different arrangements of the tunable DBRs together may result in multiple color responses, filtering and mixing effects, and pixelation, as would be known to a person skilled in the art. The DBR may be provided on flexible substrates, deformable substrates, curved substrates, and other such variations as suited to the desired application.

The tunable DBR may also be used in tunable lasers or tunable light emitting diodes, for example for tuning the output of laser light or light from a light emitting diode. Another application may be the use in optical transmission. The tunable DBR may also be used as indicators of a desired stimulus, for example voltage or current indicators.

Although the above described referred to particular examples and embodiments, these are for the purpose of illustration only and are not intended to be limiting. All references provided are hereby incorporated by reference in their entirety.

The invention claimed is:

1. A tunable photonic crystal comprising:
    a first layer comprising a first refractive index; and
    a second layer comprising a second refractive index, wherein the second layer is in contact with the first layer, wherein the first and second refractive indices are different, and
    wherein the first or second layer comprises a responsive material that is responsive to an external stimulus, wherein, in response to the external stimulus, a change in the responsive material results in a reflected wavelength of the tunable photonic crystal shifting from a first reflected wavelength to a second reflected wavelength, wherein the first layer comprises a polymer.

2. The tunable photonic crystal of claim 1, wherein the second layer comprises nano- or micro-particles.

3. The tunable photonic crystal of claim 2, wherein the second layer comprises nanoparticles that include a metal oxide.

4. The tunable photonic crystal of claim 3, wherein the metal oxide is titanium dioxide.

5. The tunable photonic crystal of claim 3, wherein the polymer is an electrically conductive polymer that comprises a redox active group.

6. The tunable photonic crystal of claim 1, wherein the external stimulus is an electrical stimulus and the responsive material is a metallopolymer having a redox response to the electrical stimulus or a piezoelectric material that exhibits a change in dimensions in response to the electrical stimulus.

7. The tunable photonic crystal of claim 6, wherein the tunable photonic crystal comprises alternating layers of the first and second layers such that the alternating layers comprise a periodic difference in the first and second refractive indices.

8. The tunable photonic crystal of claim 7, wherein the tunable photonic crystal is a one-dimensional photonic crystal.

9. The tunable photonic crystal of claim 1, wherein the tunable photonic crystal is comprised in an electrochemical cell comprising a first and second electrode and a conductive solution provided between the first and second electrodes, the solution being in electrical communication with both electrodes and the tunable photonic crystal.

10. The tunable photonic crystal of claim 9, wherein the electrochemical cell is configured to be connected to an electrical source for applying an electrical potential between the first and second electrodes to provide an electrical stimulus as the external stimulus to the tunable photonic crystal.

11. The tunable photonic crystal of claim 10, wherein the first electrode, the second electrode, or conductive solution comprises a charge-storage material.

12. The tunable photonic crystal of claim 11, wherein the charge-storage material is a conductive oxide, a conductive ceramic, a metal, a carbon, a conducting polymer, a redox-active polymer, a nanoparticle, a redox-active small molecule, or any combination thereof.

13. The tunable photonic crystal of 9, wherein the electrochemical cell further comprises a spacer between the first and second electrodes.

14. The tunable photonic crystal of claim 13, wherein the spacer is a non-conductive material comprising a thermoplastic polymer film, an adhesive-coated plastic film, an adhesive, an epoxy, or a spacer bead mixed into an adhesive or an epoxy.

15. A tunable photonic crystal, comprising:
a first layer comprising a first refractive index; and
a second layer comprising a second refractive index, wherein the second layer is in contact with the first layer, wherein the first and second refractive indices are different, and
wherein the first or second layer comprises a responsive material that is responsive to an external stimulus, wherein, in response to the external stimulus, a change in the responsive material results in a reflected wavelength of the tunable photonic crystal shifting from a first reflected wavelength to a second reflected wavelength,
wherein the first layer comprises a layer of nano- or microparticles.

16. The tunable photonic crystal of claim 15, wherein the layer of nano- or microparticles comprises magnetically responsive nano- or microparticles.

17. The tunable photonic crystal of claim 15, wherein the first layer comprises a polymer.

18. The tunable photonic crystal of claim 17, wherein the polymer is selected from the group consisting of: polyferrocenylsilanes, polythiophenes, polypyrroles, polyanilines, polyphenylene vinylenes, polyacetylenes, polyfluorenes, polyphenylenevinyidenes, polyacetylenes, conducting polymers, conjugated polymers, metallopolymers, copolymers incorporating such polymer types, polyvinylidene difluoride, and combinations thereof.

19. The tunable photonic crystal of claim 18, wherein the polymer is cross-linked.

20. The tunable photonic crystal of claim 18, wherein the polymer is a conductive polymer.

21. The tunable photonic crystal of claim 18, wherein the polymer is an insulating polymer.

22. The tunable photonic crystal of claim 15, wherein the second layer is a polymer layer.

23. A tunable photonic crystal, comprising:
a first layer comprising a first refractive index; and
a second layer comprising a second refractive index, wherein the second layer is in contact with the first layer, wherein the first and second refractive indices are different, and
wherein the first or second layer comprises a responsive material that is responsive to an external stimulus, wherein, in response to the external stimulus, a change in the responsive material results in a reflected wavelength of the tunable photonic crystal shifting from a first reflected wavelength to a second reflected wavelength,
wherein the external stimulus is a mechanical stimulus and the responsive material is expandable or compressible, a thermal stimulus, or a magnetic stimulus and the responsive material is magnetically responsive material.

24. The tunable photonic crystal of claim 23, wherein the external stimulus is a thermal stimulus.

25. The tunable photonic crystal of claim 23, wherein the external stimulus is a mechanical stimulus and the responsive material is expandable or compressible.

26. The tunable photonic crystal of claim 23, wherein the external stimulus is a magnetic stimulus and the responsive material is magnetically responsive material.

27. The tunable photonic crystal of claim 23, wherein the tunable photonic crystal comprises alternating layers of the first and second layers such that the alternating layers comprise a periodic difference in the first and second refractive indices.

28. The tunable photonic crystal of claim 27, wherein the tunable photonic crystal comprises at least 2 layers of the first layer and at least 2 layers of the second layer.

29. The tunable photonic crystal of claim 28, wherein the material is a one-dimensional photonic crystal.

30. The tunable photonic crystal of claim 27, wherein the tunable photonic crystal comprises the alternating layers of the first and second layers plus at least one additional layer of either the first or second layer.

31. The tunable photonic crystal of claim 23, wherein the first layer is a nano- or microparticle layer and the second layer is a polymer layer.

* * * * *